US012724404B2

(12) United States Patent
Shah et al.

(10) Patent No.: US 12,724,404 B2
(45) Date of Patent: Sep. 1, 2026

(54) INDUSTRIAL DATA DESTINATION TRANSFORMATION

(71) Applicant: Rockwell Automation Technologies, Inc., Mayfield Heights, OH (US)

(72) Inventors: Chirayu S Shah, Milwaukee, WI (US); Heiko Ott, Muensingen (DE); Adrian Dams, Kiln Farm (GB); Bruce McCleave, Jr., San Diego, CA (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 704 days.

(21) Appl. No.: 18/176,065

(22) Filed: Feb. 28, 2023

(65) Prior Publication Data

US 2024/0160192 A1 May 16, 2024

Related U.S. Application Data

(60) Provisional application No. 63/383,271, filed on Nov. 11, 2022.

(51) Int. Cl.
*G05B 19/418* (2006.01)
*G05B 17/02* (2006.01)
*G06F 30/20* (2020.01)

(52) U.S. Cl.
CPC ....... *G05B 19/41885* (2013.01); *G05B 17/02* (2013.01); *G05B 19/4183* (2013.01); *G05B 19/4185* (2013.01); *G06F 30/20* (2020.01)

(58) Field of Classification Search
CPC .............. G05B 19/41885; G05B 17/02; G05B 19/4183; G05B 19/4185; G05B 19/4184; G06F 30/20; G06F 30/27
(Continued)

(56) References Cited

U.S. PATENT DOCUMENTS 5,398,336 A 3/1995 Tantry et al.
6,233,611 B1 * 5/2001 Ludtke ............. H04N 21/43615 709/224
(Continued)

FOREIGN PATENT DOCUMENTS

CN 105930584 B 3/2019
CN 114490513 A * 5/2022 ............ G06F 16/116
(Continued)

OTHER PUBLICATIONS

Non-Final Office Action received for U.S. Appl. No. 18/176,019 dated Jul. 1, 2025, 15 pages.
(Continued)

*Primary Examiner* — Kamini S Shah
*Assistant Examiner* — Michael Tang
(74) *Attorney, Agent, or Firm* — Amin, Turocy & Watson, LLP

(57) ABSTRACT

Industrial data destination transformation (e.g., using a computerized tool) is enabled. For example, a system can comprise: a memory that stores executable components, and a processor, operatively coupled to the memory, that executes the executable components, the executable components comprising: a device interface component that, in response to determining a data path to be traversed to obtain industrial data, establishes a data connection along the data path from the industrial data to an industrial asset model, and a data transformation component that, in response to a determination that the industrial data comprises a first data format, converts the industrial data from the first data format to a second data format, wherein the second data format is compatible with the industrial asset model.

20 Claims, 28 Drawing Sheets

(58) Field of Classification Search
USPC .............................................................. 700/9
See application file for complete search history.

(56) References Cited

U.S. PATENT DOCUMENTS

| | | | |
|---|---|---|---|
| 6,430,455 B1 | 8/2002 | Rebello et al. | |
| 11,200,045 B1 | 12/2021 | Moyal et al. | |
| 11,290,343 B1 | 3/2022 | Isoda | |
| 2002/0123864 A1 | 9/2002 | Eryurek et al. | |
| 2007/0260410 A1 | 11/2007 | Raymond | |
| 2008/0301703 A1 | 12/2008 | Nixon et al. | |
| 2009/0037302 A1 | 2/2009 | Schulz | |
| 2009/0089227 A1 | 4/2009 | Sturrock et al. | |
| 2013/0211546 A1 | 8/2013 | Lawson et al. | |
| 2013/0212214 A1 | 8/2013 | Lawson et al. | |
| 2014/0337429 A1 | 11/2014 | Asenjo et al. | |
| 2014/0354851 A1 * | 12/2014 | Yasuoka ................. | G06F 16/11 348/231.99 |
| 2014/0365191 A1 | 12/2014 | Zyglowicz et al. | |
| 2015/0242381 A1 | 8/2015 | Oh et al. | |
| 2015/0287318 A1 | 10/2015 | Nair et al. | |
| 2016/0274553 A1 | 9/2016 | Strohmenger et al. | |
| 2016/0274978 A1 * | 9/2016 | Strohmenger ......... | G05B 15/02 |
| 2016/0365736 A1 | 12/2016 | Block et al. | |
| 2017/0076235 A1 | 3/2017 | Noto et al. | |
| 2017/0103103 A1 | 4/2017 | Nixon et al. | |
| 2017/0205813 A1 | 7/2017 | Sayyarrodsari et al. | |
| 2018/0013293 A1 | 1/2018 | Block et al. | |
| 2018/0121183 A1 | 5/2018 | Subramaniyan et al. | |
| 2019/0018394 A1 | 1/2019 | Sayyarrodsari et al. | |
| 2019/0072942 A1 | 3/2019 | Park et al. | |
| 2019/0324838 A1 | 10/2019 | Chakraborty et al. | |
| 2019/0354922 A1 | 11/2019 | Berti et al. | |
| 2020/0116887 A1 | 4/2020 | Vinay et al. | |
| 2020/0182498 A1 | 6/2020 | Ranjan et al. | |
| 2020/0201293 A1 | 6/2020 | Hou et al. | |
| 2020/0228316 A1 | 7/2020 | Cahill | |
| 2020/0265329 A1 | 8/2020 | Thomsen et al. | |
| 2021/0256070 A1 | 8/2021 | Tran et al. | |
| 2021/0302923 A1 | 9/2021 | Strohmenger et al. | |
| 2021/0329728 A1 | 10/2021 | Won et al. | |
| 2022/0100185 A1 | 3/2022 | Karri et al. | |
| 2022/0221832 A1 | 7/2022 | Chathuruthy et al. | |
| 2022/0309081 A1 | 9/2022 | Singh et al. | |
| 2022/0393952 A1 | 12/2022 | Mortsolf et al. | |
| 2023/0266986 A1 * | 8/2023 | Patnaik ................... | G06F 9/452 718/1 |
| 2024/0007504 A1 | 1/2024 | Triplet et al. | |

FOREIGN PATENT DOCUMENTS

| | | | | |
|---|---|---|---|---|
| CN | 114997436 A | | 9/2022 | |
| CN | 115544319 A | * | 12/2022 | ........... G06F 16/901 |
| EP | 2 660 667 A2 | | 11/2013 | |
| EP | 2 660 667 A3 | | 7/2016 | |
| EP | 3 070 554 A1 | | 9/2016 | |
| EP | 3 916 494 A1 | | 12/2021 | |
| JP | 3891778 B2 | * | 3/2007 | |
| WO | 2017/019860 A1 | | 2/2017 | |

OTHER PUBLICATIONS

Non-Final Office Action received for U.S. Appl. No. 18/176,026 dated Jul. 30, 2025, 31 pages.
Non-Final Office Action received for U.S. Appl. No. 18/176,041 dated Jun. 3, 2025, 12 pages.
Notice of Allowance received for U.S. Appl. No. 18/176,074 dated Jun. 10, 2025, 12 pages.
Unknown "Kafka Streams Overview" Confluent Developer, https://docs.confluent.io/platform/current/streams/overview.html, Last Accessed Sep. 13, 2023, 3 pages.
Anderson, et al. "asp.net Core Middleware", Microsoft, https://learn.microsoft.com/en-us/aspnet/core/fundamentals/middleware/?view=aspnetcore-6.0, Last Accessed Sep. 13, 2023, 17 pages.
Extended European Search Report received for European Patent Application Serial No. 23208864.1 dated Apr. 8, 2024, 11 pages.
Extended European Search Report received for European Patent Application Serial No. 23208862.5 dated Apr. 4, 2024, 10 pages.
Extended European Search Report received for European Patent Application Serial No. 23208859.1 dated Apr. 4, 2024, 10 pages.
Notice of Allowance received for U.S. Appl. No. 18/176,053 dated Sep. 9, 2025, 10 pages.
Non-Final Office Action received for U.S. Appl. No. 18/176,011 dated Sep. 24, 2025, 15 pages.
Notice of Allowance received for U.S. Appl. No. 18/176,026 dated Sep. 18, 2025, 9 pages.
Final Office Action received for U.S. Appl. No. 18/176,041 dated Oct. 8, 2025, 8 pages.
Notice of Allowance for U.S. Appl. No. 18/176,019 dated Oct. 27, 2025, 8 pages.
Notice of Allowance received for U.S. Appl. No. 18/176,011 dated Dec. 3, 2025.
Non-Final Office Action received for U.S. Appl. No. 18/176,041 dated Dec. 9, 2025, 21 pages.
Notice of Allowance received for U.S. Appl. No. 18/176,041 dated Apr. 15, 2026, 16 pages.

* cited by examiner

202
DATA MODELING AND ANALYSIS SYSTEM
416
INDUSTRIAL DATA
806
HISTORICAL DATA
242
MACHINE LEARNING COMPONENT
802
INDUSTRIAL ASSET MODEL DATA STORE
804
MACHINE LEARNING MODEL DATA STORE

2000

2002

RETRIEVING INDUSTRIAL DATA FROM AN INDUSTRIAL DEVICE REPRESENTED IN AN INDUSTRIAL ASSET MODEL, WHEREIN THE INDUSTRIAL DATA COMPRISES CONTROL DATA APPLICABLE TO THE INDUSTRIAL DEVICE AND TIMESTAMP DATA GENERATED BY THE INDUSTRIAL DEVICE CONCURRENTLY WITH THE CONTROL DATA

2004

BASED ON THE CONTROL DATA AND THE TIMESTAMP DATA, DETERMINING A QUALITY INDICATOR APPLICABLE TO THE CONTROL DATA

2006

BASED ON THE QUALITY INDICATOR, GENERATING AN OUTPUT REPRESENTATIVE OF A QUALITY OF THE CONTROL DATA

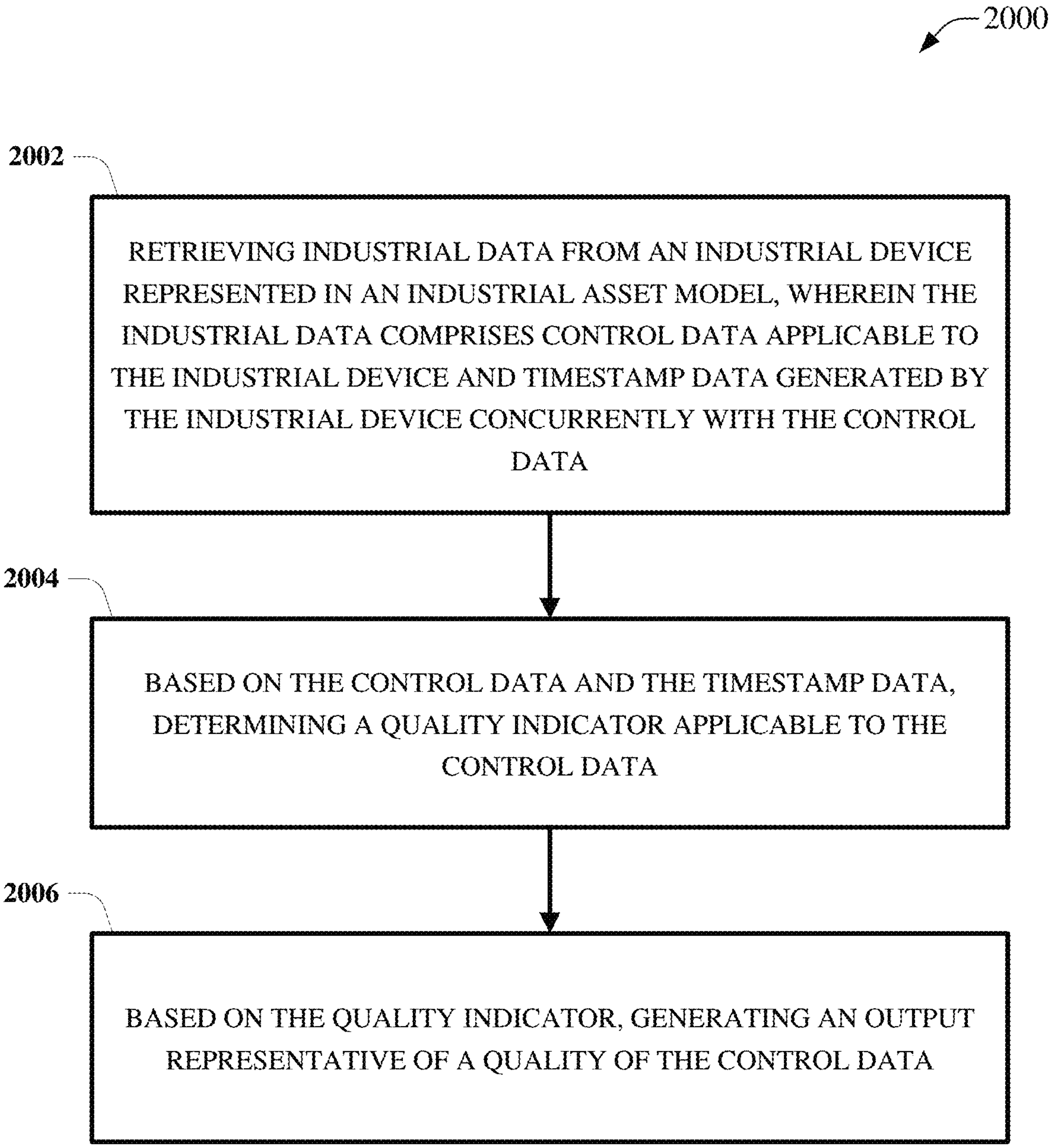

MATCHING INDUSTRIAL RELATIONAL DATA, ACCESSIBLE VIA AN INDUSTRIAL ASSET MODEL, TO AN INDUSTRIAL DEVICE REPRESENTED IN THE INDUSTRIAL ASSET MODEL

2304

IN RESPONSE TO MATCHING THE INDUSTRIAL RELATIONAL DATA TO THE INDUSTRIAL DEVICE, EXTRACTING THE INDUSTRIAL RELATIONAL DATA INTO THE INDUSTRIAL ASSET MODEL

2306

UPDATING THE INDUSTRIAL ASSET MODEL, RESULTING IN AN UPDATED INDUSTRIAL ASSET MODEL, WHEREIN UPDATING THE INDUSTRIAL ASSET MODEL COMPRISES ASSOCIATING THE INDUSTRIAL RELATIONAL DATA WITH THE INDUSTRIAL DEVICE

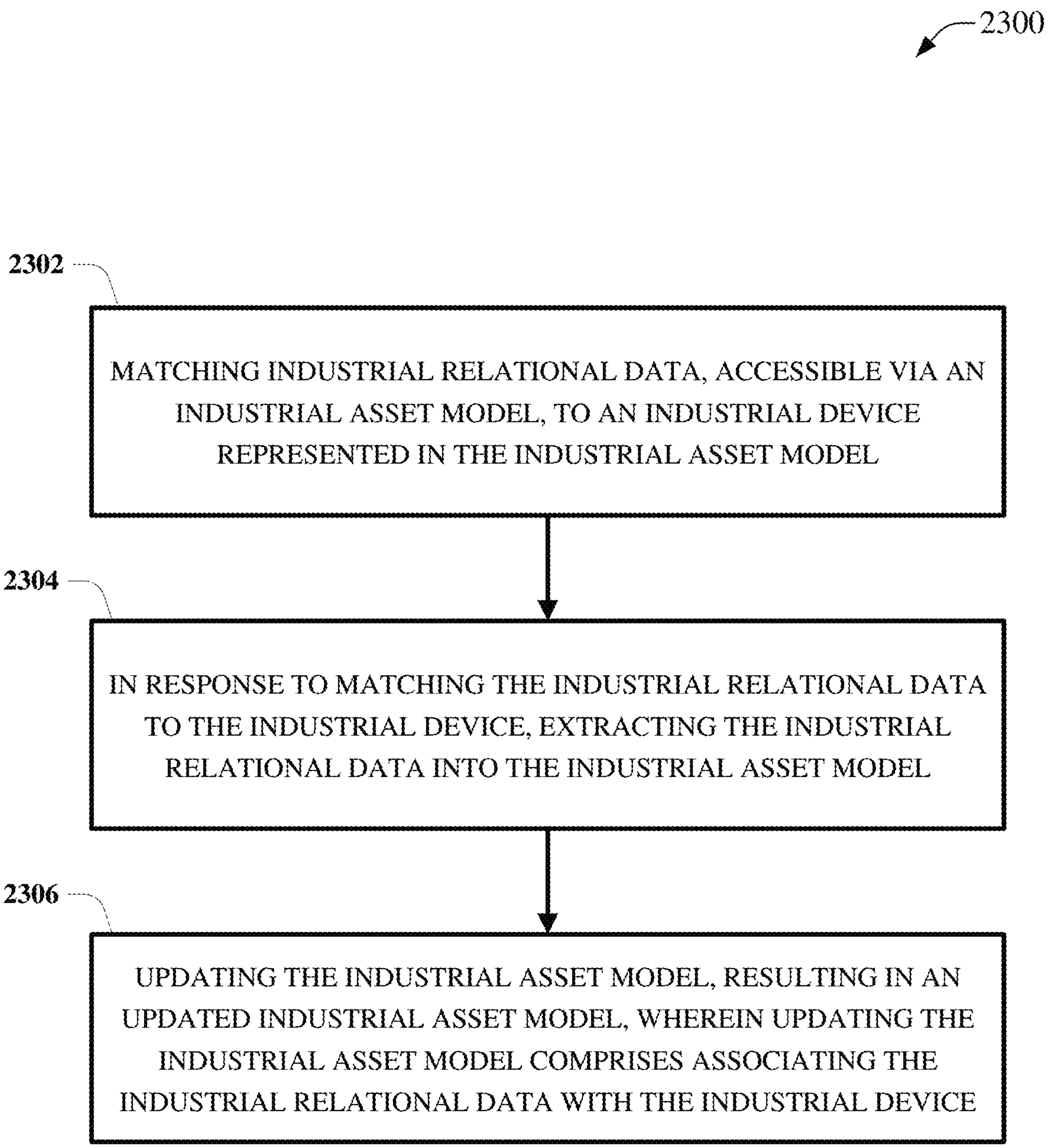

IN RESPONSE TO DETERMINING A DATA PATH TO BE TRAVERSED TO OBTAIN INDUSTRIAL DATA, ESTABLISHING A DATA CONNECTION ALONG THE DATA PATH FROM THE INDUSTRIAL DATA TO AN INDUSTRIAL ASSET MODEL

2504

IN RESPONSE TO A DETERMINATION THAT THE INDUSTRIAL DATA COMPRISES A FIRST DATA FORMAT, CONVERTING THE INDUSTRIAL DATA FROM THE FIRST DATA FORMAT TO A SECOND DATA FORMAT, WHEREIN THE SECOND DATA FORMAT IS COMPATIBLE WITH THE INDUSTRIAL ASSET MODEL

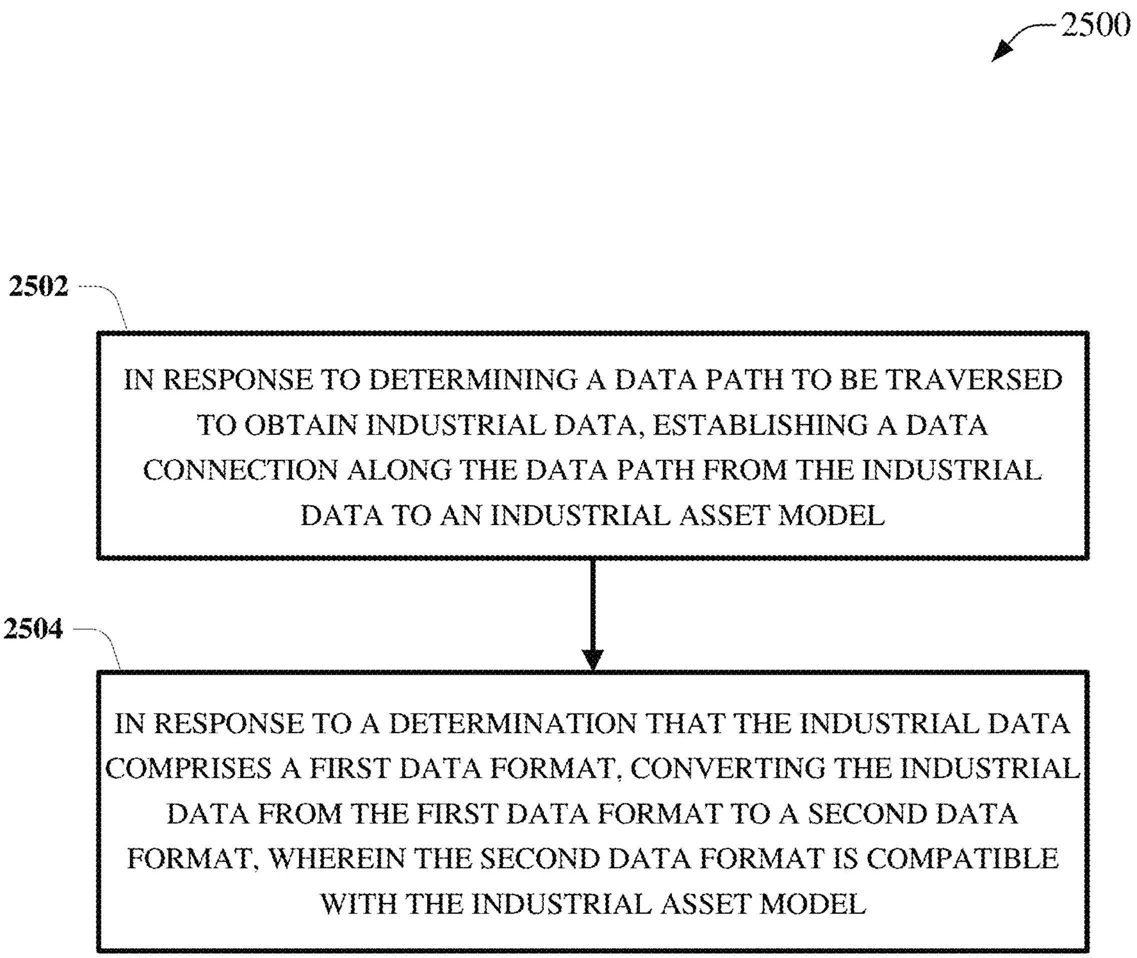

FIG. 25

INDUSTRIAL DATA DESTINATION TRANSFORMATION

CROSS-REFERENCE TO RELATED APPLICATION

This application claims the benefit of U.S. Provisional Patent Application No. 63/383,271, filed on Nov. 11, 2022, and entitled "INDUSTRIAL AUTOMATION DATA QUALITY AND ANALYSIS," which is incorporated by reference herein in its entirety.

BACKGROUND

The subject matter disclosed herein relates generally to industrial automation systems and, more particularly, to industrial asset modeling and associated components and operations.

BRIEF DESCRIPTION

The following presents a simplified summary in order to provide a basic understanding of some aspects described herein. This summary is not an extensive overview nor is it intended to identify key/critical elements or to delineate the scope of the various aspects described herein. Its sole purpose is to present some concepts in a simplified form as a prelude to the more detailed description that is presented later.

According to an embodiment, a system can comprise: a memory that stores executable components, and a processor, operatively coupled to the memory, that executes the executable components, the executable components comprising: a device interface component that, in response to determining a data path to be traversed to obtain industrial data, establishes a data connection along the data path from the industrial data to an industrial asset model, and a data transformation component that, in response to a determination that the industrial data comprises a first data format, converts the industrial data from the first data format to a second data format, wherein the second data format is compatible with the industrial asset model.

In another embodiment, a method can comprise: in response to determining a data path to be traversed to obtain industrial data, establishing, by an industrial system comprising a processor, a data connection along the data path from the industrial data to an industrial asset model, and in response to a determination that the industrial data comprises a first data format, converting, by the industrial system, the industrial data from the first data format to a second data format, wherein the second data format is compatible with the industrial asset model.

In yet another embodiment, a non-transitory computer-readable medium can have stored thereon instructions that, in response to execution, cause an industrial device comprising a processor to perform operations, the operations comprising: in response to determining a data path to be traversed to obtain industrial data, establishing a data connection along the data path from the industrial data to an industrial asset model, and in response to a determination that the industrial data comprises a first data format, converting the industrial data from the first data format to a second data format, wherein the second data format is compatible with the industrial asset model.

To the accomplishment of the foregoing and related ends, certain illustrative aspects are described herein in connection with the following description and the annexed drawings.

These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIG. 20 is a block flow diagram for a process associated with industrial automation data quality and analysis in accordance with one or more embodiments described herein.

FIG. 23 is a block flow diagram for a process associated with industrial automation relational data extraction, connection, and mapping in accordance with one or more embodiments described herein.

FIG. 25 is a block flow diagram for a process associated with industrial data destination transformation in accordance with one or more embodiments described herein.

DETAILED DESCRIPTION

Figure 1:
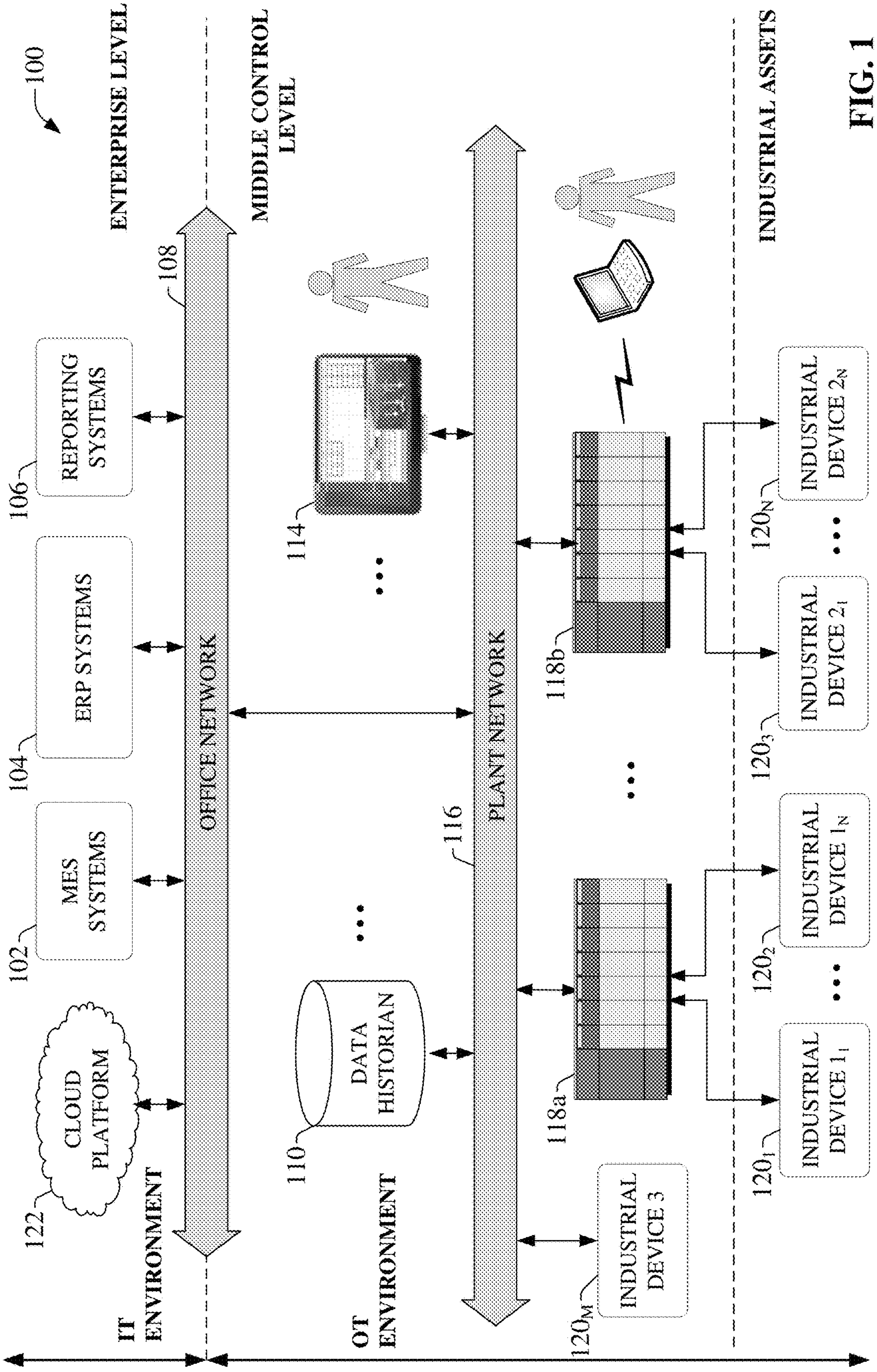
FIG. 1 is a block diagram of an example industrial control environment in accordance with one or more embodiments described herein.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers, including cloud-based computing systems. Also, components as described herein can execute from various computer readable storage media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Industrial controllers, their associated I/O devices, motor drives, and other such industrial devices are central to the operation of modern automation systems. Industrial controllers interact with field devices on the plant floor to control automated processes relating to such objectives as product manufacture, material handling, batch processing, supervisory control, and other such applications. Industrial controllers store and execute user-defined control programs to effect decision-making in connection with the controlled process. Such programs can include, but are not limited to, ladder logic, sequential function charts, function block diagrams, structured text, C++, Python, JavaScript, or other such platforms.

A data modeling and analysis system herein can generate an industrial asset model of an industrial automation system based on, for instance, collected engineering documentation, control files, and other relevant information associated with the industrial automation system. During runtime, information about the automation system encoded in the industrial asset model can be leveraged to improve the quality of a range of analytics. In various embodiments, a system herein can enhance the collected operational and status data with metadata identifying the location of origin of the data as well as a quality indicator conveying the degree of reliability of the data. This contextualized data is further enhanced by device-level times stamps applied to the data by the industrial devices themselves. In further embodiments, systems herein can enable further functionality, such industrial data extraction, industrial data writeback, industrial data analysis, industrial data path determination, industrial asset model versioning control and access, industrial asset model rollback, industrial automation relational data extraction, connection, and mapping, conditional industrial data source connection, industrial data destination transformation, industrial automation data staging and transformation, or other such functionality.

FIG. 1 is a block diagram of an example industrial environment 100. In this example, a number of industrial controllers 118 (e.g., industrial devices) are deployed throughout an industrial plant environment to monitor and control respective industrial systems or processes relating to product manufacture, machining, motion control, batch processing, material handling, or other such industrial functions. Industrial controllers 118 typically execute respective control programs to facilitate monitoring and control of industrial devices 120 making up the controlled industrial assets or systems (e.g., industrial machines). One or more industrial controllers 118 can also comprise a soft controller executed on a personal computer, on a server blade, or other hardware platform, or on a cloud platform. Some hybrid devices can also combine controller functionality with other functions (e.g., visualization). The control programs executed by industrial controllers 118 can comprise any conceivable type of code used to process input signals read from the industrial devices 120 and to control output signals generated by the industrial controllers, including but not limited to ladder logic, sequential function charts, function block diagrams, structured text, C++, Python, JavaScript, etc.

Industrial devices 120 can include input devices that provide data relating to the controlled industrial systems to the industrial controllers 118, output devices that respond to control signals generated by the industrial controllers 118 to control aspects of the industrial systems, or devices that act as both input and output devices. Example input devices can include telemetry devices (e.g., temperature sensors, flow meters, level sensors, pressure sensors, etc.), manual operator control devices (e.g., push buttons, selector switches, etc.), safety monitoring devices (e.g., safety mats, safety pull cords, light curtains, etc.), and other such devices. Output devices can include motor drives, pneumatic actuators, signaling devices, robot control inputs, valves, and the like. Some industrial devices, such as industrial device 120M, can operate autonomously on the plant network 116 without being controlled by an industrial controller 118.

Industrial controllers 118 can communicatively interface with industrial devices 120 over hardwired connections or over wired or wireless networks. For example, industrial controllers 118 can be equipped with native hardwired inputs and outputs that communicate with the industrial devices 120 to effect control of the devices. The native controller I/O can include digital I/O that transmits and receives discrete voltage signals to and from the field devices, or analog I/O that transmits and receives analog voltage or current signals to and from the devices. The controller I/O can communicate with a controller's processor over a backplane such that the digital and analog signals can be read into and controlled by the control programs. Industrial controllers 118 can also communicate with industrial devices 120 over the plant network 116 using, for example, a communication module or an integrated networking port. Exemplary networks can include the Internet, intranets, Ethernet, EtherNet/IP, DeviceNet, ControlNet, Data Highway and Data Highway Plus (DH/DH+), Remote I/O, Fieldbus, Modbus, Profibus, wireless networks, serial protocols, and the like. The industrial controllers 118 can also store persisted data values that can be referenced by the control program and used for control decisions, including but not limited to measured or calculated values representing operational states of a controlled machine or process (e.g., tank levels, positions, alarms, etc.) or captured time series data that is collected during operation of the automation system (e.g., status information for multiple points in time, diagnostic occurrences, etc.). Similarly, some intelligent devices—including but not limited to motor drives, instruments, or condition monitoring modules—can store data values that are used for control and/or to visualize states of operation. Such devices can also capture time-series data or events on a log for later retrieval and viewing.

Industrial automation systems often include one or more human-machine interfaces (HMIs) 114 that allow plant personnel to view telemetry and status data associated with the automation systems, and to control some aspects of system operation. HMIs 114 can communicate with one or more of the industrial controllers 118 over a plant network 116, and exchange data with the industrial controllers to facilitate visualization of information relating to the controlled industrial processes on one or more pre-developed operator interface screens. HMIs 114 can also be configured to allow operators to submit data to specified data tags or memory addresses of the industrial controllers 118, thereby providing a means for operators to issue commands to the controlled systems (e.g., cycle start commands, device actuation commands, etc.), to modify setpoint values, etc. HMIs 114 can generate one or more display screens through which the operator interacts with the industrial controllers 118, and thereby with the controlled processes and/or systems. Example display screens can visualize present states of industrial systems or their associated devices using graphical representations of the processes that display metered or calculated values, employ color or position animations based on state, render alarm notifications, or employ other such techniques for presenting relevant data to the operator. Data presented in this manner is read from industrial controllers 118 by HMIs 114 and presented on one or more of the display screens according to display formats chosen by the HMI developer. HMIs 114 can comprise fixed location or mobile devices with either user-installed or pre-installed operating systems, and either user-installed or pre-installed graphical application software. HMIs 114 can communicatively interface with other devices or components herein over hardwired connections or over wired or wireless networks. For example, HMIs 114 can be equipped with native hardwired inputs and outputs that communicate with other devices or components herein to facilitate control of those devices or components.

Some industrial environments can also include other systems or devices relating to specific aspects of the controlled industrial systems. These can include, for example, one or more data historians 110 that aggregate and store production information collected from the industrial controllers 118 and other industrial devices. Such data historians 110 can collect, store, and/or analyze industrial data from one or more of a variety of industrial processes, components, and/or systems. This industrial data can be used for analysis, reporting, decision-making, or for other suitable purposes. The data historians 110 can collect industrial data from sensors and other devices connected to industrial devices herein, and can store this industrial data in a database (e.g., of the data historian 110 or in a databased or data store communicatively coupled to the data historian 110) for later retrieval and analysis. The data historian 110 can further comprise one or more components for visualizing or analyzing the industrial data, or for generating reports or alerts based on the industrial data.

Industrial devices 120, industrial controllers 118, HMIs 114, associated controlled industrial assets, and other plant-floor systems such as data historians 110, vision systems, and other such systems operate on the operational technology (OT) level of the industrial environment. Higher level analytic and reporting systems can operate at the higher enterprise level of the industrial environment in the information technology (IT) domain; e.g., on an office network 108 or on a cloud platform 122. Such higher level systems can include, for example, enterprise resource planning (ERP) systems 104 that integrate and collectively manage high-level business operations, such as finance, sales, order management, marketing, human resources, or other such business functions. Manufacturing Execution Systems (IVIES) 102 can monitor and manage control operations on the control level given higher-level business considerations. Reporting systems 106 can collect operational data from industrial devices on the plant floor and generate daily or shift reports that summarize operational statistics of the controlled industrial assets.

Figure 2:
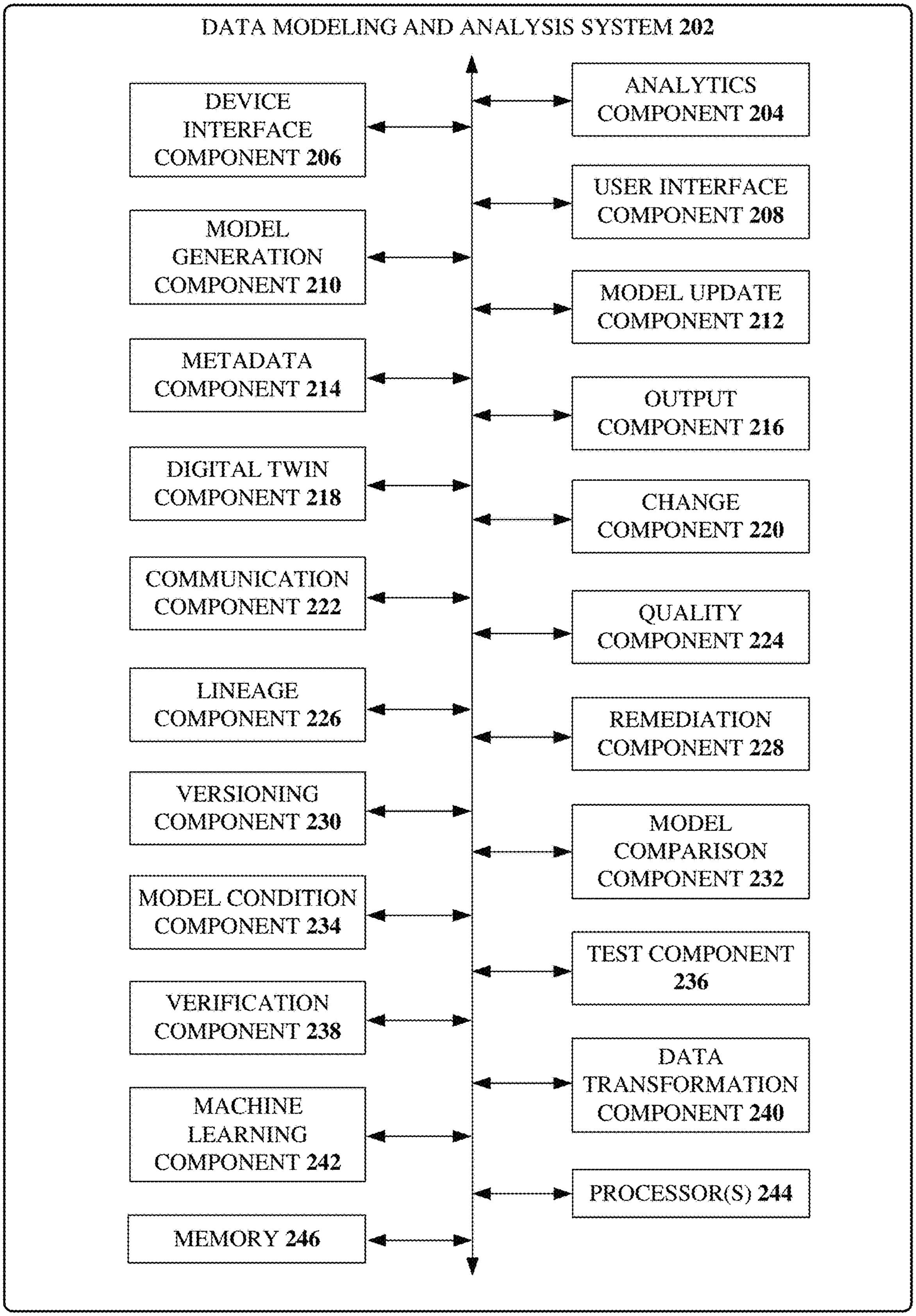
FIG. 2 is a block diagram of an example data modeling and analysis system in accordance with one or more embodiments described herein.

FIG. 2 is a block diagram of an example data modeling and analysis system 202 according to one or more embodiments of this disclosure. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described. In some embodiments, the data modeling and analysis system 202 can comprise a cloud-based data modeling and analysis system 202. While components 204-242 of the data modeling and analysis system 202 are each briefly described below, components 204-242 are later described in greater detail in respective contexts.

Data modeling and analysis system 202 can comprise an analytics component 204, a device interface component 206, a user interface component 208, a model generation component 210, a model update component 212, a metadata component 214, an output component 216, a digital twin component 218, a change component 220, a communication component 222, a quality component 224, a lineage component 226, a remediation component 228, a versioning component 230, a model comparison component 232, a model condition component 234, a test component 236, a verification component 238, a data transformation component 240, a machine learning component 242, one or more processors 244, and/or memory 246. In various embodiments, one or more of the analytics component 204, device interface component 206, user interface component 208, model generation component 210, model update component 212, metadata component 214, output component 216, digital twin component 218, change component 220, communication component 222, quality component 224, lineage component 226, remediation component 228, versioning component 230, model comparison component 232, model condition component 234, test component 236, verification component 238, data transformation component 240, machine learning component 242, processor(s) 244, and/or memory 246 can be electrically and/or communicatively coupled to one another to perform one or more of the functions of the data modeling and analysis system 202. In some embodiments, components 204, 206, 208, 210, 212, 214, 216, 218, 220, 222, 224, 226, 228, 230, 232, 234, 236, 238, 240, and/or 242 can comprise software instructions stored on memory 246 and executed by processor(s) 244. The data modeling and analysis system 202 can also interact with other hardware and/or software components not depicted in FIG. 2. For example, processor(s) 216 can interact with one or more HMIs 114 or external user interface devices, such as a keyboard, a mouse, a display monitor, a touchscreen, or other such interface devices. In some embodiments, the data modeling and analysis system 202 can execute on a cloud platform as a set of cloud-based services. In various embodiments, the data modeling and analysis system 202 can serve as an extraction layer that executes above the operational technology (OT) level devices and applications, and can serve as a bridge to information technology (IT) systems and analytics tools.

The analytics component 204 can be configured to apply analytics to the operational and status data collected from the automation systems. The analytics component 204 can reference information contained in an industrial asset model herein as part of this analysis. Analytics component 204 can apply one or more of a variety of analytics applications or algorithms to operational and status data herein, leveraging knowledge about corresponding automation system, and respective devices or components, encoded in a corresponding industrial asset model. In this regard, the analytics component 204 can generate analytical data applicable to an industrial device herein using, for instance, a defined analytical algorithm or application. Such applications can include, but are not limited to, predictive maintenance applications or algorithms, energy management or prediction applications or algorithms, batch reporting applications or algorithms, applications or algorithms capable of predicting asset failures, asset performance management application or algorithms, or other suitable applications or algorithms.

Device interface component 206 can be configured to exchange industrial data between the data modeling and analysis system 202 and sources of industrial data at one or more plant facilities. Sources of industrial data that can be accessed by the device interface component 206 can include, but are not limited to, industrial controllers, telemetry devices, motor drives, quality check systems (e.g., vision systems or other quality verification systems), industrial safety systems, cameras or other types of optical sensors, data collection devices (e.g., industrial data historians), other equipment or machinery used in an industrial setting, or other suitable information sources. The device interface component 206 can also access sources of engineering files or related data, including but not limited to engineering drawings or schematics (e.g., computer-aided design (CAD) files), three-dimensional schematics, control program files (e.g., files that define control programs and controller configuration information that can be installed and executed on industrial controllers 118), or other such engineering data. In some embodiments, device interface component 206 can exchange data with these data sources via the plant or office networks on which the data sources reside. In various implementations, the device interface component 206 can exchange such data directly with the data sources or via a gateway device (e.g., later discussed in greater detail) communicatively coupled between the data source and the device interface component 206. Device interface component 206 can also receive at least some of the data via a public network such as the Internet in some embodiments. The device interface component 206 can directly access the data generated by these industrial devices and systems via the one or more public and/or private networks in some embodiments. Alternatively, device interface component 206 can access the data on these data sources via a proxy or edge device 404 that aggregates the data from multiple industrial devices for migration to the data modeling and analysis system 202 via the device interface component 206. In further embodiments, the device interface component 206 can match industrial data herein to other data or to industrial devices herein. In additional embodiments, the device interface component 206 can apply changes to industrial devices to which the device interface component 206 is communicatively coupled to. It is also noted that the device interface component 206 can establish data connections between a variety of devices, components, or entities, such as industrial asset models, industrial historian devices, industrial devices, or other suitable devices, components, or entities.

The user interface component 208 can comprise a hardware and/or software that enables a user to interact with a system or another component herein. The user interface component 208 can be configured to exchange information between the data modeling and analysis system 202 and a client device (e.g., authorized device 1302 or HMI 114) having authorization to access the data modeling and analysis system 202. In some embodiments, user interface component 208 can be configured to generate and deliver interface displays to the client device that allow the user to view analytic results generated by the analytics component 204, view aspects of the industrial asset model, or interface with the data modeling and analysis system 202 in other suitable ways.

The model generation component 210 can be configured to generate an industrial asset model (e.g., industrial asset model 418) that can be, for instance, leveraged by various types of analytic applications and systems based on information about a collection of industrial assets (e.g., industrial devices) obtained by the device interface component 206. The industrial asset model 418 can comprise a digital representation of a physical industrial device, such as industrial controllers, telemetry devices, motor drives, quality check systems (e.g., vision systems or other quality verification systems), industrial safety systems, cameras or other types of optical sensors, data collection devices (e.g., industrial data historians), or other equipment or machinery used in an industrial setting. The industrial asset model 418 can take various forms, such as a mathematical or simulation model, and can be used for a variety of purposes, such as maintenance scheduling, capacity planning, and production forecasting. The industrial asset model 418 can comprise data on an industrial device's design, construction, and operating conditions, as well as performance data such as energy consumption, output, and downtime. The industrial asset model 418 can be utilized to predict how the industrial device will perform under different conditions, and to identify potential issues before they occur, thus enabling for proactive maintenance and improving overall asset reliability. The industrial asset model 418 can be implemented to facilitate enhanced communion between engineering and operations systems and units. Once generated, the industrial asset model 418 can provide a highly granular knowledge of industrial system and equipment, and how they operate and interact. By integrating the industrial asset model 418 with real-time data and real-time operation, analysis of real-time data using the industrial asset model 418 can enable predictive maintenance or other projections, energy usage estimations, etc. The foregoing can facilitate improved operations control, such as with improved predicative maintenance. In one or more embodiments, the industrial asset model 418 can comprise a JavaScript object notion (JSON) type industrial asset model. In further embodiments, the industrial asset model 418 can comprise another defined file system.

The model update component 212 can perform respective updates to industrial asset models described herein. In this regard, the model update component 212 can associate industrial data 416 with industrial device herein represented in an industrial asset model 418. For example, collection of additional industrial data (e.g., industrial data 416) can be utilized to improve accuracy and/or performance of an industrial asset model 418 herein. The model update component 212 can thus leverage such additional industrial data to update a corresponding industrial asset model 418 described herein.

The metadata component 214 can be configured to apply contextual metadata to operational and status data collected from the devices of an industrial automation system. This contextual metadata can include, but are not limited to, quality labels indicating a reliability of the data and location information indicating a pathway to the location of origin of the data. Other examples of contextual metadata herein can comprise one or more of date or time at which the data was collected or created, location where the data was collected, device, sensor and/or software utilized to collect the data, conditions under which the data was collected (e.g., temperature, humidity, lighting, atmospheric conditions, sound level, external conditions), intended use of the data (e.g., research, development, analysis, reporting, etc.), or other suitable types of contextual metadata.

Some of the contextual metadata, such as the location information, can be applied based on information obtained from the industrial asset model. In this regard, the metadata component 214 can apply origination or lineage metadata to collected items of time-stamped control data, including data obtained from level 0 devices (e.g., devices that are the lowest level of the control hierarchy, such as sensors or actuators that are directly connected to the physical processes), which can identify the location of origin of time-stamped control data herein.

The output component 216 can facilitate display or transmission information of a variety of data or other information herein. The output component be communicatively coupled to, or can itself comprise, display devices or speaker devices for displaying visual or auditory output, or a network interface for transmitting data to other devices, components, or systems. Thus, the output component 216 can generate or render a variety of context-dependent outputs or data outputs that can be utilized or consumed by other devices, components, or systems. Such outputs can be in a variety of forms, such as numeric, text, graphical, audio, video, binary, analog, control signals, or in other suitable forms. In some embodiments, the output component 216 can generate an output that can be rendered via an HMI 114 or an authorized external device.

The digital twin component 218 can be configured to generate a digital twin (e.g., digital twin 602) based on industrial data described herein and/or using an industrial asset model herein (e.g., or using an updated industrial asset model herein). In this regard, the industrial asset model 418 can serve as the basis for a digital twin of its corresponding automation systems. It is noted that the digital twin 602 can comprise a mathematical or virtual representation of functionality of the industrial device, which can be utilized for monitoring, simulation, prediction, or other suitable uses.

The change component 220 can determine one or more of a variety of changes associated with industrial asset models or industrial devices described herein. For instance, the change component 220 can utilize an industrial asset model 418 to determine a change to a corresponding industrial device represented in that industrial asset model 418. Such a change can comprise, for instance, a parameter of a control file of an industrial device described herein. Additionally, or alternatively, such a change can comprise an addition of an industrial device to an industrial asset model described herein or a removal of an industrial device from an industrial asset model. In another example, the change component 220 can determine changes to apply to industrial devices (e.g., by leveraging the industrial asset model 418).

The communication component 222 can send or receive data associated with the data modeling and analysis system 202. For example, the communication component 222 can facilitate communication between the data modeling and analysis system 202, office network 108, plant network 116, and/or corresponding devices, other systems, components, platforms, external devices, authorized devices, etc. The communication component 222 can be configured to send and/or receive various instructions applicable to the data modeling and analysis system 202. The communication component 222 can comprise the hardware required to implement a variety of communication protocols (e.g., infrared ("IR"), shortwave transmission, near-field communication ("NFC"), Bluetooth, Wi-Fi, long-term evolution ("LTE"), 3G, 4G, 5G, 6G, global system for mobile communications ("GSM"), code-division multiple access ("CDMA"), satellite, visual cues, radio waves, etc.)

The quality component 224 can (e.g., based on one or more of a variety of types of data or information) determine a quality indicator or quality score. Such a quality indicator or score can be based on completeness of the data, validity of the data, accuracy of the data, consistency of the data, timeliness of the data, uniqueness of the data, integrity of the data, relevance of the data, or can be based on other suitable quality metrics. In an example, the quality component 224 can determine a quality indicator applicable to control data herein. The quality component 224 can make such a determination based on timestamp data associated with the control data (e.g., generated by a level 0 device). In another example, the quality component 224 can further determine a quality indicator based on contextual metadata described herein. In additional embodiments, the quality component 224 can determine a quality indicator herein using a data quality model generated using a machine learning component 242 (later described in greater detail).

The lineage component 226 can determine data path information representative of a data path between an industrial device and an industrial asset model. The data path can comprise a route that industrial data (e.g., industrial data 416) takes as it travels from source (e.g., an industrial device) to destination (e.g., an industrial asset model or data modeling and analysis system 202). The data path can comprise various devices and connections that the data passes through on its way from source to destination, such as routers, switches, gateways, networks, physical cables, or other connections that link the source and destination together. The data path also comprise applicable security measures (e.g., data compression or encryption) utilized to ensure that data is transmitted efficiently and securely.

The remediation component 228 can generate one or more of a variety of recommendations applicable to an industrial device herein (e.g., in response to a determination that a quality indicator determined by the quality component 224) does not satisfy a defined data quality threshold). For example, the remediation component 228 can generate a recommendation, to apply to the industrial device or industrial asset model, in order to satisfy such a defined data quality threshold. The remediation component 228 can utilize a remediation model that has been generated (e.g., by the machine learning component 242) based on past remedies applicable to various industrial devices (e.g., previous or past industrial devices) in order to generate the aforementioned recommendation. In an example, such a recommendation can comprise, for instance, a change to parameter of a control file of an industrial device described herein.

The versioning component 230 can store versions of industrial asset models in applicable industrial asset model data stores herein (e.g., industrial asset model data store 802). The versioning component 230 can comprise version control capability that can further perform versioning control for industrial asset models herein. For example, the versioning component 230 can revert an industrial asset model 418 from a second version (e.g., of the industrial asset model 418) to a first version (e.g., of the industrial asset model 418) in response to a defined revert condition being determined to be satisfied.

The model comparison component 232 can determine one or more differences between versions of industrial asset models herein. To determine a difference between versions of industrial asset models, the model comparison component 232 can, for instance, utilize one or more of a variety of comparison methods, such as visual comparison, dimensional comparison, parametric comparison, functional comparison, data comparison, digital twin comparison, or another suitable version comparison method. Such differences can comprise one or more of a variety of differences, such as industrial devices represented in the respective industrial asset model, parameters associated with the aforementioned industrial devices, a difference in respective outputs between the first version of the industrial asset model and the second version of the industrial asset model, or other differences between versions.

The test component 236 can facilitate a test of one or more industrial asset models or versions of industrial asset models (e.g., according to a defined asset model test). Such a defined asset model test can be configured to test performance, stability, repeatability, accuracy, precision, or other suitable metrics applicable to an industrial asset model described herein. In this regard, a defined revert condition that can be utilized by the versioning component 230 can comprise a failure of the aforementioned test (e.g., the test facilitated by the test component 236).

The verification component 238 can verify a change applicable to the industrial device or industrial asset model described herein. Such a change can comprise, for instance, a parameter of a control file of an industrial device described herein. Additionally, or alternatively, such a change can comprise an addition of an industrial device to an industrial asset model described herein or a removal of an industrial device from an industrial asset model. It is noted that the verification component 238 can verify such a change according to a defined change verification criterion. Such a defined change verification criterion can be based on, or can utilize, hash-based data verification or checksum-based data verification, digital signature verification, error detection codes, data logs, data replication, or other suitable data change verification. In other embodiments, the verification component 238 can verify the change using a change model (e.g., that has been generated using machine learning applied to past changes to various industrial devices). Additionally, or alternatively, the verification component 238 can determine whether a change herein comprises an authorized change. In this regard, the verification component 238 can generate an alert if the change is not an authorized change, or can cause the device interface component 206 to facilitate reversion of the change. In further embodiments, the verification component 238 can verify (e.g., according to the defined verification criterion) the reverting of an industrial asset model from a second version to a first version.

The data transformation component 240 can determine data formats (e.g., of industrial data described herein) and/or compatibility of data formats with various industrial asset models described herein. This can provide uniformity for use in industrial asset models herein or for other consumers of industrial data herein. Such formats can comprise one or more binary, American standard code for information interchange (ASCII), comma-separated values (CSV), JSON, Modbus, open platform communications (OPC), open platform communications unified architecture (OPC-UA), message queuing telemetry transport (MATT), PLC format, or another suitable data format. The data transformation component 240 can further convert industrial data (e.g., industrial data 416) between respective formats. For example, the data transformation component 240 can (e.g., in response to a determination that the industrial data comprises a first data format) convert the industrial data 416 from a first data format (e.g., a format not compatible with the industrial asset model 418) to a second data format (e.g., to a second data format compatible with the industrial asset model 418).

The machine learning component 242 can be utilized to perform a variety of data analysis and/or generate a variety of machine learning based models herein. Such machine learning based models can comprise data quality models, remediation models, change models, matching models, or other suitable machine learning based models. It is noted that such machine learning based models can be stored in a machine learning model data store (e.g., machine learning model data store 804). It is further noted that various embodiments described herein can employ artificial-intelligence or machine learning systems and techniques to facilitate learning user behavior, context-based scenarios, preferences, etc. in order to facilitate taking automated action with high degrees of confidence. Utility-based analysis can be utilized to factor benefit of taking an action against cost of taking an incorrect action. Probabilistic or statistical-based analyses can be employed in connection with the foregoing and/or the following. Systems and/or associated controllers, servers, or machine learning components described herein can comprise artificial intelligence component(s) which can employ an artificial intelligence model and/or machine learning or a machine learning model that can learn to perform the above or below described functions (e.g., via training using historical training data and/or feedback data). In some embodiments, machine learning component 242 can comprise an artificial intelligence and/or machine learning model that can be trained (e.g., via supervised and/or unsupervised techniques) to perform the above or below-described functions using historical training data comprising various context conditions that correspond to various augmented network optimization operations. In this example, such an artificial intelligence and/or machine learning model can further learn (e.g., via supervised and/or unsupervised techniques) to perform the above or below-described functions using training data comprising feedback data, where such feedback data can be collected and/or stored (e.g., in memory) by the machine learning component 242. In this example, such feedback data can comprise the various instructions described above/below that can be input, for instance, to a system herein, over time in response to observed/stored context-based information. Artificial intelligence or machine learning components herein can initiate an operation(s) associated with a based on a defined level of confidence determined using information (e.g., feedback data). For example, based on learning to perform such functions described above using feedback data, performance information, and/or past performance information herein, a machine learning component 242 herein can initiate an operation associated with determining various thresholds herein (e.g., a motion pattern thresholds, input pattern thresholds, similarity thresholds, authentication signal thresholds, audio frequency thresholds, or other suitable thresholds). In an embodiment, the machine learning component 242 can perform a utility-based analysis that factors cost of initiating the above-described operations versus benefit. In this embodiment, the machine learning component 242 can use one or more additional context conditions to determine various thresholds herein.

To facilitate the above-described functions, a machine learning component 242 herein can perform classifications, correlations, inferences, and/or expressions associated with principles of artificial intelligence. For instance, the machine learning component 242 can employ an automatic classification system and/or an automatic classification. In one example, the machine learning component 242 can employ a probabilistic and/or statistical-based analysis (e.g., factoring into the analysis utilities and costs) to learn and/or generate inferences. The machine learning component 242 can employ any suitable machine-learning based techniques, statistical-based techniques and/or probabilistic-based techniques. For example, the machine learning component 242 can employ expert systems, fuzzy logic, support vector machines (SVMs), Hidden Markov Models (HMIs), greedy search algorithms, rule-based systems, Bayesian models (e.g., Bayesian networks), neural networks, other non-linear training techniques, data fusion, utility-based analytical systems, systems employing Bayesian models, and/or the like. In another example, the machine learning component 242 can perform a set of machine-learning computations. For instance, the machine learning component 242 can perform a set of clustering machine learning computations, a set of logistic regression machine learning computations, a set of decision tree machine learning computations, a set of random forest machine learning computations, a set of regression tree machine learning computations, a set of least square machine learning computations, a set of instance-based machine learning computations, a set of regression machine learning computations, a set of support vector regression machine learning computations, a set of k-means machine learning computations, a set of spectral clustering machine learning computations, a set of rule learning machine learning computations, a set of Bayesian machine learning computations, a set of deep Boltzmann machine computations, a set of deep belief network computations, and/or a set of different machine learning computations.

The one or more processors 244 can perform one or more of the functions described herein with reference to the systems and/or methods disclosed. Memory 246 can be a computer-readable storage medium storing computer-executable instructions and/or information for performing the functions described herein with reference to the systems and/or methods disclosed.

Figure 3:
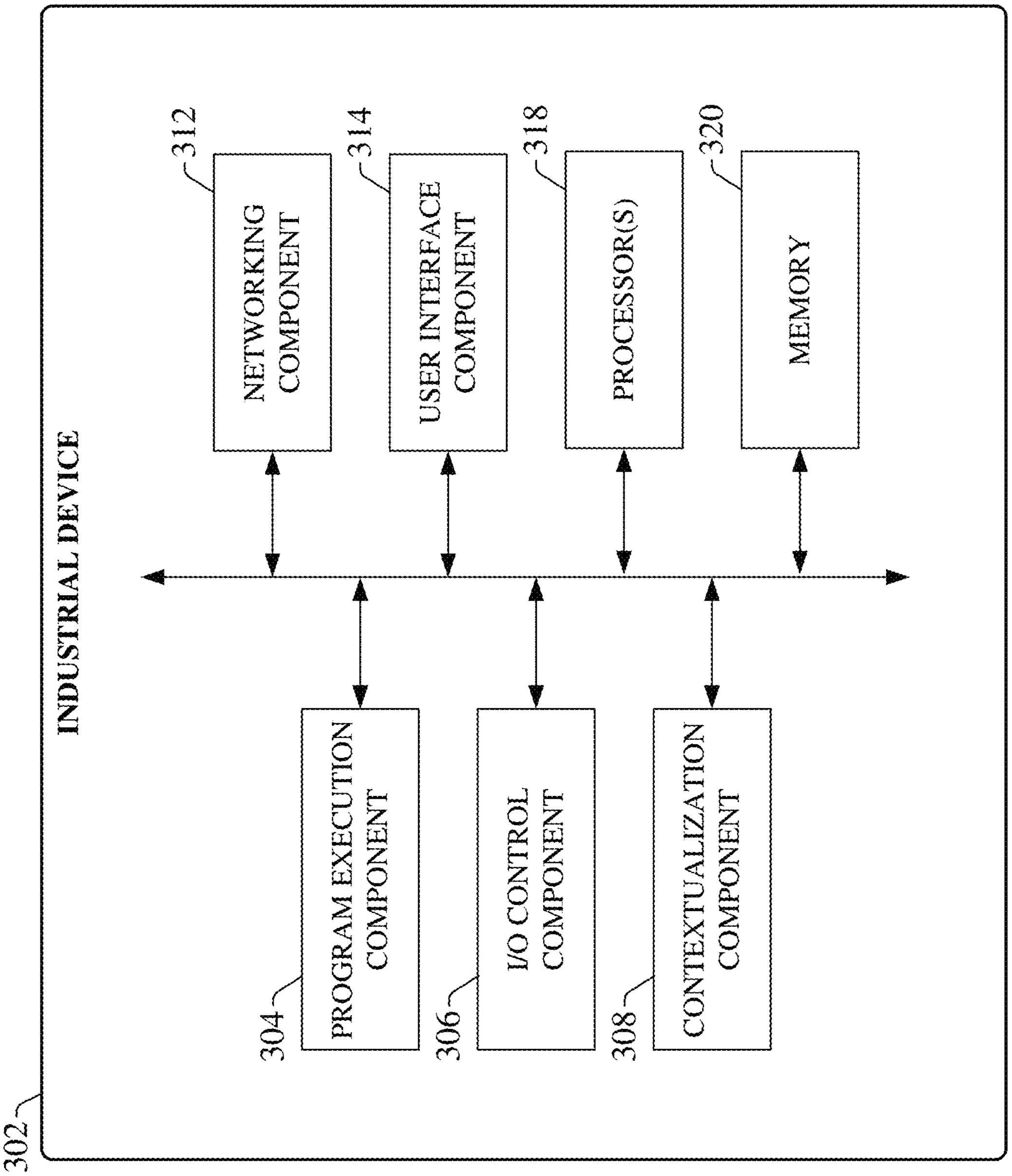
FIG. 3 is a block diagram of an example industrial device that supports contextualization and exposure of its data to the data modeling and analysis system in accordance with one or more embodiments described herein.

FIG. 3 is a block diagram of an example industrial device 302 that supports contextualization and exposure of its data to the data modeling and analysis system 202 according to one or more embodiments of this disclosure. While industrial device 302 can comprise substantially any type of data-generating industrial device, including but not limited to an industrial controller, a motor drive, an HMI terminal, a vision system, an industrial optical scanner, or other suitable device or system, the example industrial device 302 illustrated in FIG. 3 is assumed to be an industrial controller (e.g., similar to industrial controller 118). Industrial device 302 can comprise a program execution component 304, an I/O control component 306, a contextualization component 308, a networking component 312, a user interface component 314, one or more processors 318, and memory 320. In various embodiments, one or more of the program execution component 304, I/O control component 306, contextualization component 308, networking component 312, user interface component 314, the one or more processors 318, and memory 320 can be electrically and/or communicatively coupled to one another to perform one or more of the functions of the industrial device 302. In some embodiments, components 304, 306, 308, 312, and 314 can comprise software instructions stored on memory 320 and executed by processor(s) 318. The industrial device 302 can also interact with other hardware and/or software components not depicted in FIG. 3. For example, processor(s) 318 can interact with one or more external user interface devices, such as a keyboard, a mouse, a display monitor, a touchscreen, or other such interface devices. Further, the industrial device 302 can be configured to communicate with one or more authorized external devices.

Program execution component 304 can be configured to compile and execute a user-defined control program or executable interpreted code. In various embodiments, the control program can be written in any suitable programming format (e.g., ladder logic, sequential function charts, structured text, C++, Python, JavaScript, etc.) and/or can be downloaded to the industrial device 302. Typically, the control program uses data values read by the industrial device's analog and digital inputs as input variables, and sets values of the industrial device's analog and digital outputs in accordance with the control program instructions based in part on the input values. I/O control component 306 can be configured to control the electrical output signals of the industrial device's digital and analog electrical outputs in accordance with the control program outputs, and to convert electrical signals on the industrial device's analog and digital inputs to data values that can be processed by the program execution component 304.

Contextualization component 308 can be configured to add contextual metadata to data items generated by the industrial device 302 (e.g., data generated in connection with executing the industrial control program). This contextual metadata can include, but is not limited to, timestamps corresponding to the time at which the data was generated and/or quality indicators indicative of a reliability or quality of the industrial data described herein. Other examples of contextual metadata herein can comprise one or more of date or time at which the data was collected or created, location where the data was collected, device, sensor and/or software utilized to collect the data, conditions under which the data was collected (e.g., temperature, humidity, lighting, atmospheric conditions, sound level, external conditions), intended use of the data (e.g., research, development, analysis, reporting, etc.), or other suitable types of contextual metadata.

Networking component 312 can be configured to exchange data with one or more external devices over a wired or wireless network using any suitable network protocol. User interface component 314 can be configured to receive user input and to render output to the user in any suitable format (e.g., visual, audio, tactile, etc.). In some embodiments, user interface component 314 can be configured to communicatively interface with a development application that executes on a client device (e.g., a laptop computer, tablet computer, smart phone, etc.) that is communicatively connected to the industrial device 302 (e.g., via a hardwired or wireless connection). The user interface component 314 can then receive user input data and render output data via the development application. In other embodiments, user interface component 314 can be configured to generate and serve suitable graphical interface screens to a client device, and exchange data via these graphical interface screens. Input data that can be received via user interface component 314 can include, but is not limited to, user-defined control programs or routines, data tag definitions, smart tag metadata configurations, or other suitable data.

The one or more processors 318 can perform one or more of the functions described herein with reference to the systems and/or methods disclosed. Memory 320 can be a computer-readable storage medium storing computer-executable instructions and/or information for performing the functions described herein with reference to the systems and/or methods disclosed.

Figure 4:
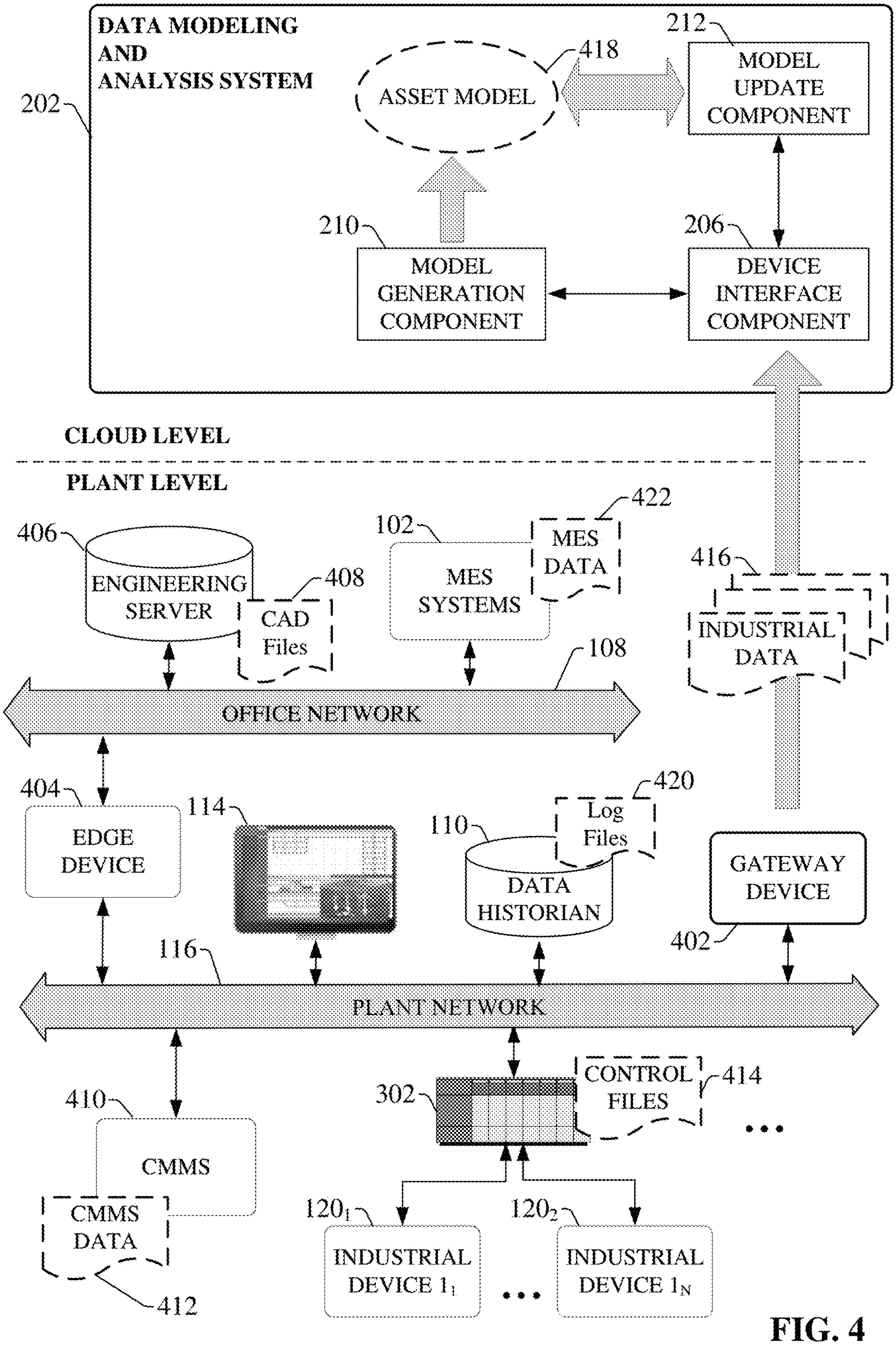
FIG. 4 is a diagram illustrating an example architecture in which the data modeling and analysis system executes on a cloud platform and collects diverse sets of data from industrial devices and engineering systems residing in a plant facility, and generates an industrial asset model based on this collected information, in accordance with one or more embodiments described herein.

FIG. 4 is a diagram illustrating an example architecture in which the data modeling and analysis system 202 executes on a cloud platform and collects diverse sets of data from industrial devices and engineering systems residing in a plant facility, and generates an industrial asset model 418 based on this collected information. In various embodiments, the industrial asset model 418 can be implemented to facilitate enhanced communion between engineering and operations systems and/or units. Once generated, the industrial asset model 418 can provide a highly granular knowledge of industrial system and equipment, and how they operate and interact. By integrating the industrial asset model 418 with real-time data and real-time operation, analysis of real-time data using the industrial asset model 418 can enable predictive maintenance or other projections, energy usage estimations, etc. The foregoing can facilitate improved operations control, such as with improved predicative maintenance. The industrial data 416 can comprise one or more of a variety of data or files that can be collected by the device interface component 206 or used by the model generation component 210 to build the industrial asset model 418. Such industrial data 416 can include, but is not limited to, control files 414 installed on industrial controllers 118 or 302 (e.g., which define the industrial control programs executed on those industrial controllers 118, as well as the I/O configuration and network settings for the industrial controllers 118), CMMS data 412 obtained from computerized maintenance management systems (CMMS) 410, log files 420 containing archived production data stored on a data historian 110, engineering schematics (e.g., 2D or 3D schematics) such as CAD files 408 stored on engineering servers 406, IVIES data 422 obtained from an IVIES system 102, engineering manuals, industrial device instruction manual data, templates, streaming data, or other suitable data or information. In further embodiments, the industrial data 416 can additionally, or alternatively, comprise location data representative of a location of the industrial device. The device interface component 206 can retrieve this information as extracted data (e.g., industrial data 416). It is noted that, in various embodiments, the industrial data 416 can comprise structured or unstructured industrial data. Such unstructured data can comprise, for instance, data that does not comprise a specific defined format or structure, or that does not adhere a specific set or rules or conventions. For example, such unstructured data can comprise text, audio data, video data, image data, or other unstructured data applicable to the industrial device. Exemplary video feeds or images herein can originate from a line camera on a plant floor or otherwise in an industrial setting. Structured data herein can comprise data that is organized in a specific, defined way, and/or adheres to a defined format, such as rows or columns in a spreadsheet or data table. The collected industrial data 416 can be used by the model generation component 210, or another suitable component herein, to add detail and/or context to the industrial asset model 418.

In various embodiments, the model generation component 210 can generate the industrial asset model 418 based on asset data representative of industrial devices (e.g., industrial device 302) represented in an industrial automation system or plant facility, and/or based on communication pathways between the respective industrial devices. Such a communication pathway can comprise the means by which two or more industrial devices herein exchange information with each other including, but not limited to, wired or wireless connections, as well as various protocols and standards that are used to transmit and receive data herein. The industrial asset model 418 that is generated by the model generation component 210, based on this extracted data (e.g., industrial data 416), can digitally represent the automation systems and associated industrial devices commissioned in a plant facility, including the machines that make up the systems, identities of the industrial devices (e.g., industrial controllers 118 and associated industrial devices 120), the communication pathways between devices of the automation systems, and other such information. In this regard, the model generation component 210 can generate the industrial asset model 418 based on asset data or industrial data representative of industrial devices represented in an industrial automation system, and/or based on communication pathways between the industrial devices represented in the industrial automation system.

In an example, a beverage bottling facility can comprise a data modeling and analysis system 202, described herein. Bottles in the facility can travel on conveyers and pass across imaging devices at speeds that are too fast for a human eye to recognize discrepancies in bottling (e.g., underfilled by 1% or 2%). However, a system herein (e.g., the data modeling and analysis system 202) can utilize omni-detection and/or sensor fusion from one or more of a variety of sensors (e.g., conveyor position sensors, cameras, etc.) and/or inputs to determine such bottling discrepancies and/or determine applicable corrective measures. In this regard, the industrial asset model 418 can consolidate unstructured data herein (e.g., image or video data) with structured data sources.

In the example illustrated in FIG. 4, the device interface component 206 can access the industrial data 416 via a gateway device 402 that resides on the plant network 116, however, in some scenarios the device interface component 206 can extract information directly from industrial devices herein via any intervening public or private networks. It is noted that the gateway device 402 can further connect industrial devices herein or controllers herein to other networks, such as plant networks, office networks, cloud networks, or other suitable networks. The gateway device 402 can perform one or more of a variety of functions, such as protocol conversion, data filtering and processing, data security implementation, remote access, and/or scalability functions.

Figure 5:
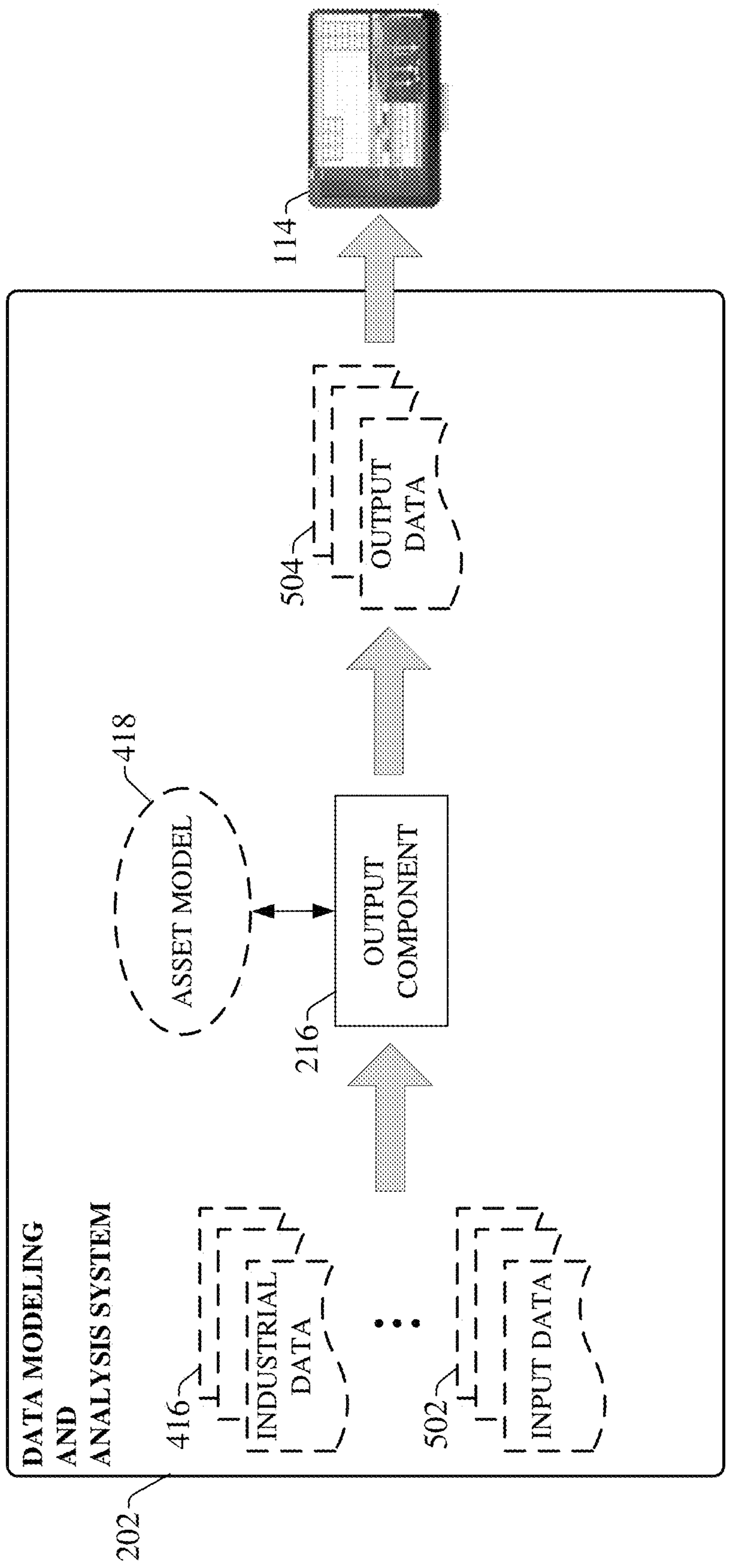
FIG. 5 is a diagram illustrating exemplary output generation using an industrial asset model, after industrial data extraction, in accordance with one or more embodiments described herein.

In the illustrated example of FIG. 4, the device interface component 206 can match industrial data 416 to an industrial device represented in the industrial asset model 418. Such industrial data 416 can be accessible via the industrial asset model 418 and/or determined (e.g., by the device interface component 206) not to be currently represented in the industrial asset model 418. Upon a match of such industrial data to a corresponding industrial device, the device interface component 206 can further extract the industrial data 416 into the industrial asset model 418. Using this extracted industrial data, the model update component 212 can update the industrial asset model 418 to yield an updated industrial asset model 418. In this regard, the model update component 212 can associate the industrial data 416 with the respective industrial device. FIG. 5 is a diagram illustrating exemplary output generation using an industrial asset model 418 (e.g., after industrial data extraction) in accordance with one or more embodiments described herein.

Figure 6:
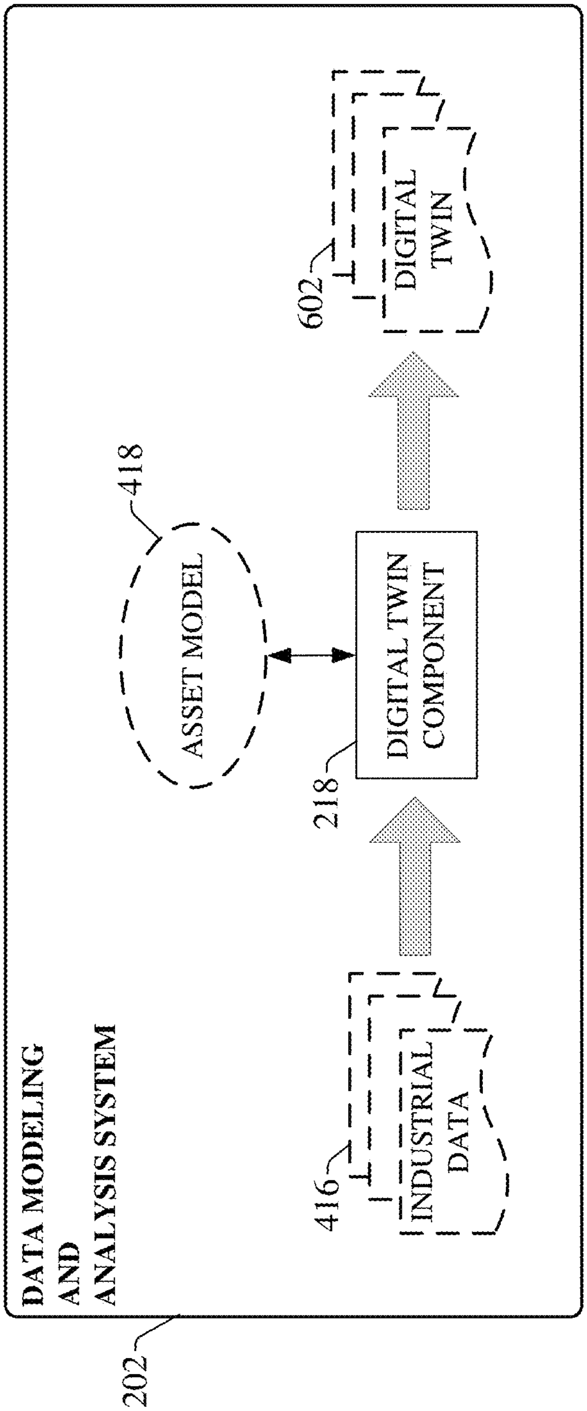
FIG. 6 is a diagram illustrating exemplary digital twin generation using an industrial asset model, after industrial data extraction, in accordance with one or more embodiments described herein.

As illustrated in FIG. 5, the output component 216 can (e.g., using the updated industrial asset model described above) generate an output (e.g., output data 504) applicable to the industrial device based on the industrial data 416 or other suitable input data 502. The output data 504 can be rendered via an HMI 114 or another suitable device. The output data 504 can be generated in one or more a variety of forms (e.g., depending on the medium intended to render the output), such as numeric, text, graphical, audio, video, binary, analog, control signals, or in other suitable forms. In some embodiments, the output component 216 can generate an output that can be rendered via an HMI 114 or an authorized external device. FIG. 6 is a diagram illustrating exemplary digital twin generation using an industrial asset model (e.g., after industrial data extraction) in accordance with one or more embodiments described herein. In this regard, the industrial asset model 418 can serve as the basis for a digital twin 602 (e.g., as generated by the digital twin component 218) of its corresponding automation systems. The digital twin component 218 can thus generate the digital twin 602 using the industrial asset model 418 and/or based on industrial data 416 or other suitable data. In various implementations, the digital twin 602 can be representative of a singular industrial device or of a plurality of industrial devices. It is noted that the digital twin 602 can comprise a mathematical or virtual representation of functionality of an industrial device, or collection of industrial device, which can be utilized for monitoring, simulation, prediction, or other suitable uses. Digital twins herein can be improved, for instance, as a result of increased context (e.g., contextual metadata, live data, historical data, timestamped control data, etc.) provided by the industrial asset model 418.

Figure 7:
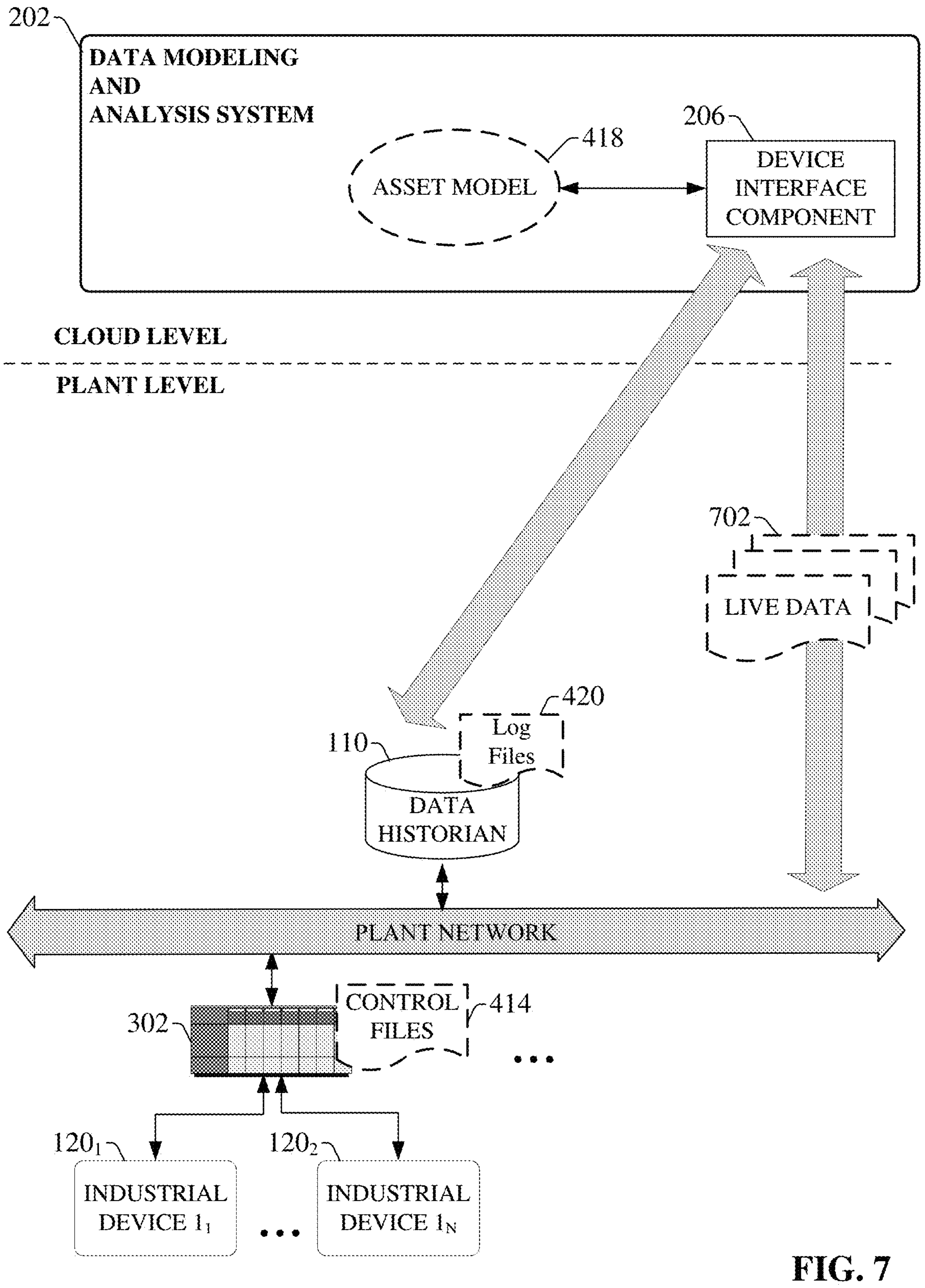
FIG. 7 is a diagram illustrating exemplary industrial data extraction in accordance with one or more embodiments described herein.

FIG. 7 is a diagram illustrating exemplary industrial data extraction in accordance with one or more embodiments described herein. As illustrated in FIG. 7, the device interface component 206 can retrieve various types of industrial data, including live data 702 (e.g., live data from an industrial device or controller) or historical data (e.g., historical data stored in a data historian 110 or from an industrial device or controller). Live data 702 can be representative of data that is generated in real-time from an industrial controller or device, whereas historical data can be representative of data that has been collected over time (e.g., via a data historian 110) and/or stored for later analysis. To this and various other ends, the industrial asset model 418 can comprise live data applicable to an industrial device and/or historical data applicable to the industrial device. By leveraging both live and historical data sources (e.g., both applicable to a common industrial device or system), accuracy and reliability of predictions associated with that industrial device or system using the industrial asset model 418 can be improved. It is noted that industrial data 416 can comprise the live data 702 and/or the historical data (e.g., log files 420 or other suitable historical data applicable to an industrial device described herein).

Figure 8:
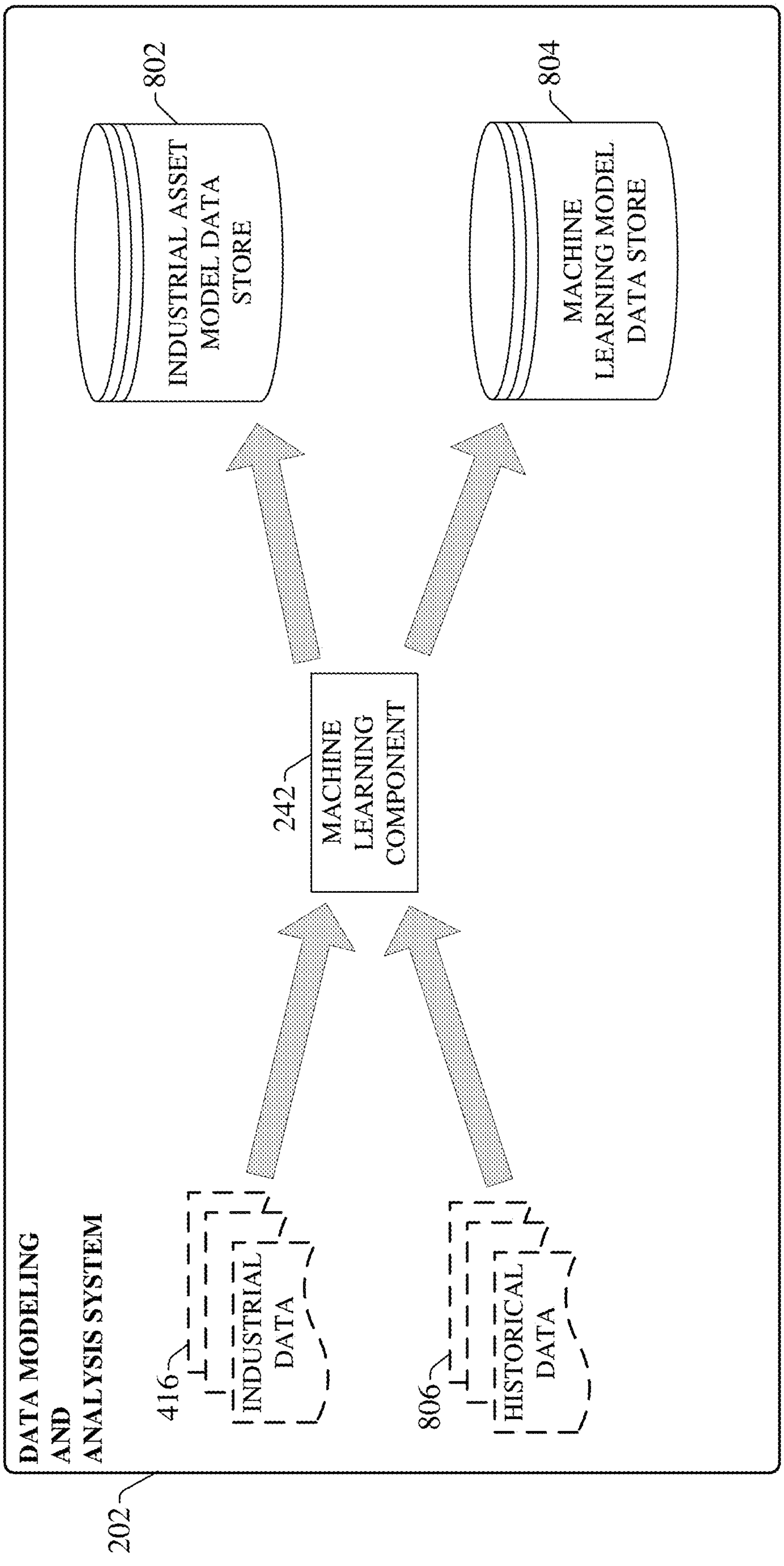
FIG. 8 is a diagram illustrating exemplary model generation using machine learning in accordance with one or more embodiments described herein.

FIG. 8 is a diagram illustrating exemplary model generation using machine learning in accordance with one or more embodiments described herein. The machine learning component 242 can be utilized to generate one or more of a variety models in accordance with various embodiments described herein. Implementation and utilization of such models is later described in greater detail. In an example, the machine learning component 242 can utilize past or historical industrial data 806 applicable to one or more of a variety of industrial devices in order to generate a matching model, which can be utilized by the machine learning component 242 or other components herein to match industrial relational data described herein to a corresponding industrial device. In another example, the machine learning component 242 can utilize the past or historical industrial data 806 applicable to one or more of a variety of industrial devices in order to generate a change model, which can be utilized to verify a change to an industrial device herein and/or an industrial asset model herein. In another example, the machine learning component 242 can utilize past or historical industrial data 806 applicable to one or more of a variety of industrial devices in order to generate a data quality model, which can be utilized in order to determine a data quality indicator and/or data quality score. In yet another example, the machine learning component 242 can utilize past or historical industrial data 806 applicable to one or more of a variety of industrial devices in order to generate a remediation model, which can be utilized in order to generate a recommendation applicable to a corresponding industrial device (e.g., to correct a problem or defect with the respective industrial device). The foregoing models can be stored, by the machine learning component 242 in the machine learning model data store 804 (e.g., of the data modeling and analysis system 202) so that other components of the data modeling and analysis system 202 can utilize the models generated by the machine learning component 242. In some embodiments, industrial asset models herein (e.g., the industrial asset model 418) can be generated by the machine learning component 242, based on historical and/or current industrial data. Such industrial asset models can be stored by the machine learning component 242 in the industrial asset model data store 802 (e.g., of the data modeling and analysis system 202) so that other components of the data modeling and analysis system 202 can utilize the industrial asset models generated by the machine learning component 242 or that are otherwise stored in the industrial asset model data store 802 (e.g., not generated using machine learning).

Figure 9:
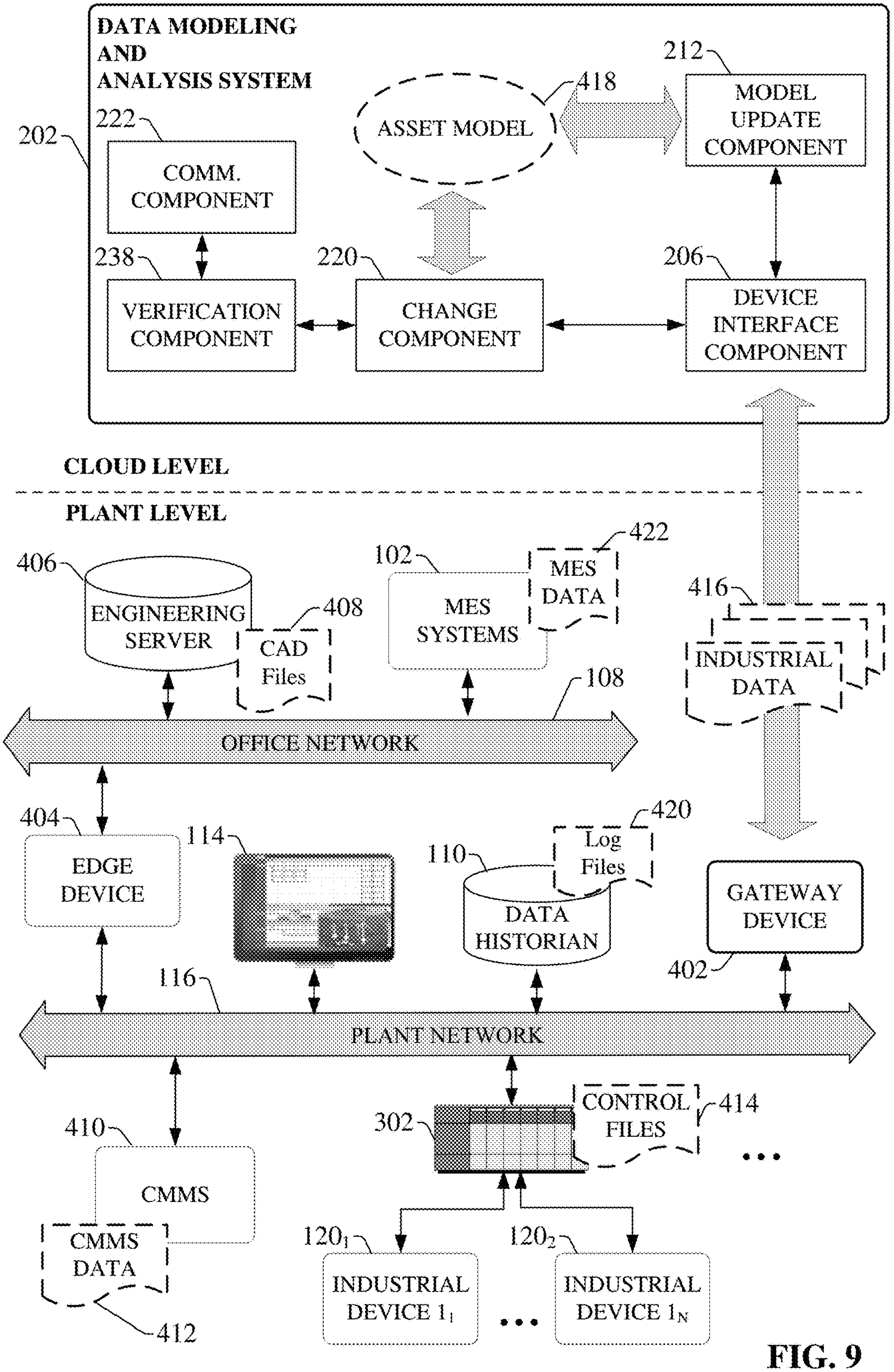
FIG. 9 is a diagram illustrating an example architecture in which the data modeling and analysis system executes on a cloud platform and facilitates industrial data source write-back in accordance with one or more embodiments described herein.

FIG. 9 is a diagram illustrating an example architecture in which the data modeling and analysis system 202 executes on a cloud platform and facilitates industrial data source writeback in accordance with one or more embodiments described herein. Industrial data source writeback herein can comprise systems, components, processes, or services that enable data source writeback capability associated with an industrial asset model 418 herein. Industrial data writeback herein is enabled not only to industrial controllers, but also to historian devices (e.g., data historian 110) and/or other devices or systems authorized to interface with the data modeling and analysis system 202 and/or industrial asset model 418. Industrial data writeback can occur, for instance, when a change made to an industrial asset model 418 is propagated to the industrial devices or systems that it represents. Such writeback capability can maintain synchronization between an industrial device herein and an industrial asset model that includes a representation of that industrial device. To propagate such a change to an industrial device, a change component 220 can (e.g., using an industrial asset model 418) first determine a change applicable to an industrial device represented in an industrial asset model (e.g., industrial asset model 418). In this example, the change is first made in the industrial asset model 418, rather than the industrial device itself first. Such a change can comprise, for instance, a parameter of a control file 414 of an industrial device 302 or an industrial device 120, or another change. A model update component 212 can then, based on the change, update the industrial asset model 418 (e.g., resulting in an updated industrial asset model). The updated industrial asset model can thus include the aforementioned change. With this updated industrial asset model, the device interface component 206 can then apply the aforementioned change to the industrial device. It is noted that applying the change (e.g., by the device interface component 206) to the industrial device can comprise writing data, corresponding to the change, to the industrial device. In some embodiments, the device interface component 206 can apply the change to the industrial device via a gateway device 402 communicatively coupled to the industrial device. In further embodiments, the device interface component 206 can apply the change to a data historian 110 communicatively coupled to the industrial asset model 418.

It is noted that the industrial asset model 418 can (e.g., via the data modeling and analysis system 202) establish a connection back to a source of industrial data 416 herein. The source of the industrial data 416 can comprise an industrial device 302, industrial controller 118, industrial device 120, or another originating source of the industrial data 416. Using this connection, the device interface component 206 can write data associated with the change to the source of the industrial data. It is noted that the data modeling and analysis system 202 can further track the audit, security, or redundancy requirements associated with the change to ensure that the change is correctly made and that corresponding historical data is recorded (e.g., how the change was made, which entity made the change, when the change was made, why the change was made, which industrial device received the change, etc.) The foregoing can facilitate compliance (e.g., in a regulated environment) or enable possible reversion to a state prior to the change. Further, such writeback capability can incorporate versioning capability (e.g., later discussed in greater detail). In some embodiments, a change (e.g., a first change) to an industrial device can necessitate making another change (e.g., a second change) to the same industrial device or to a different industrial device. For example, changing a first parameter may necessitate changing another parameter. In this regard, the change component 220 can determine (e.g., based on the first change and using the industrial asset model), a second change to be applied to the industrial device. By determining such second changes, industrial device stability can be enhanced.

In various embodiments, an output component 216 (not depicted in FIG. 9) can generate an output representative of the above-described change to the industrial device. Such an output can comprise data path information representative of a data path (e.g., communication pathways between industrial devices, comprising the industrial device, represented in the industrial asset model) traversed to apply the change. The output can be in one or more of a variety of forms, such as numeric, text, graphical, audio, video, binary, analog, control signals, or in other suitable forms. In some embodiments, the output component 216 can generate an output that can be rendered via an HMI 114 or an authorized external device. According to an embodiment, a communication component 222 can receive instruction data representative of an instruction to apply the above-described change to an industrial device. Such an instruction can be received by the communication component 222 from an authorized internal device. In other embodiments, such an instruction can be received via a user interface component 208. In this regard, the change component 220 can be caused to determine the above-described change based on the instruction.

With reference again to FIG. 9, the verification component 238 can verify a change applicable to an industrial device represented in an industrial asset model (e.g., industrial asset model 418). In some embodiments, the verification component 238 can verify the change according to a defined change verification criterion. Such a defined change verification criterion can be based on, or utilize, hash-based data verification or checksum-based data verification, digital signature verification, error detection codes, data logs, data replication, or other suitable data change verification. In other embodiments, the verification component 238 can verify the change using a change model generated using machine learning applied to past changes to other industrial devices (e.g., other than the instant industrial device). Additionally, or alternatively, the verification component 238 can determine whether the change comprises an authorized change (e.g., according to a defined authorization criterion). Such an authorization criterion can comprise whether the change is made by an authorized device, whether the change was made at an authorized time, whether the change was approved by an approval entity, whether the change would cause a shutdown of a corresponding industrial device, or another suitable authorization criterion. In this regard, the verification component 238 can generate an alert if the change is not an authorized change, or can cause the device interface component 206 to facilitate reversion of the change. Such an alert can be rendered, for instance, via the output component 216 (not depicted in FIG. 9) in one or more of a variety of forms, such as numeric, text, graphical, audio, video, binary, analog, control signals, or in other suitable forms. In some embodiments, the output component 216 can generate an output, representative of the alert, that can be rendered via an HMI 114 or an authorized external device.

Figure 10:
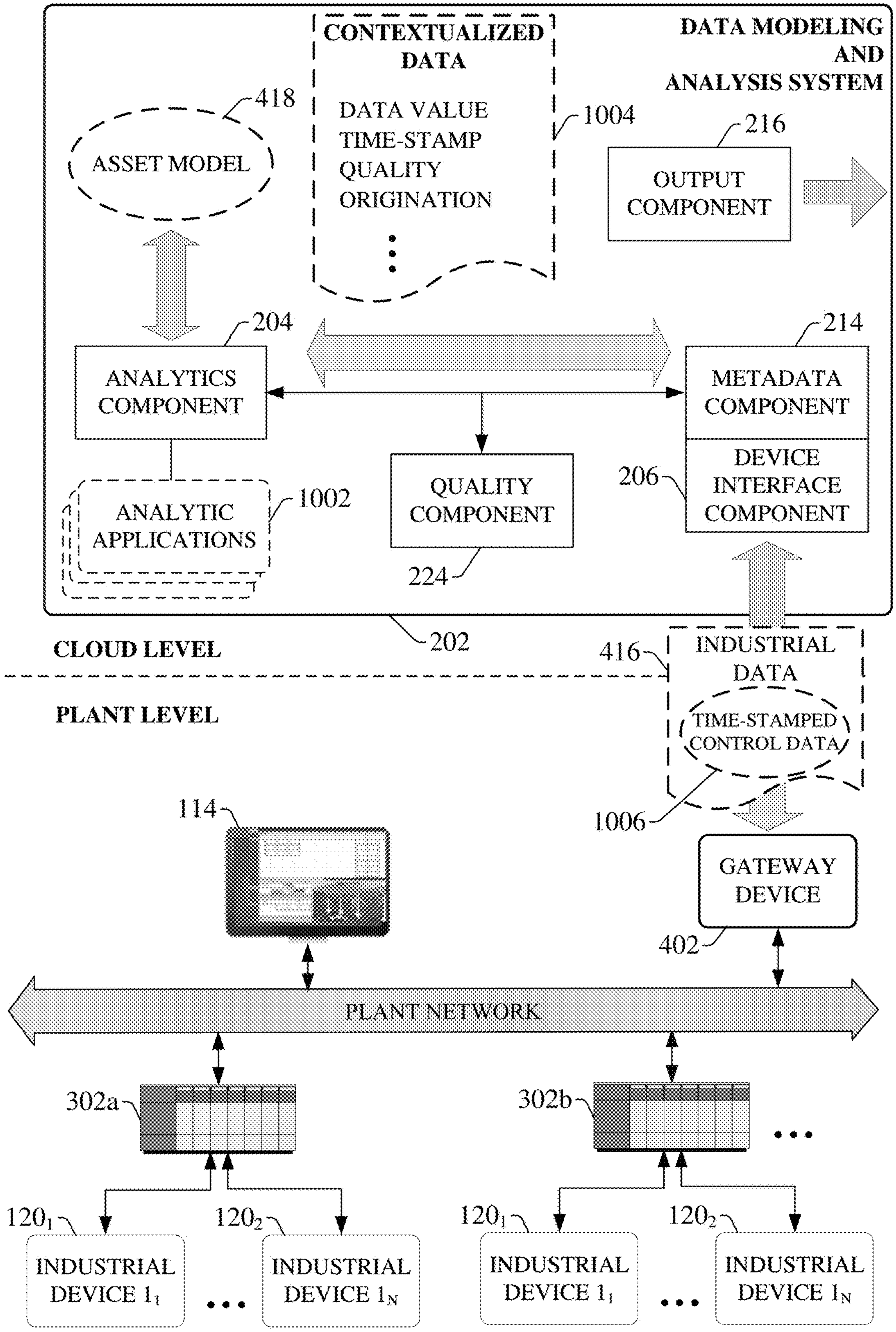
FIG. 10 is a diagram illustrating an example architecture in which the data modeling and analysis system executes on a cloud platform and facilitates collection of time-series control data from automation system devices by the data modeling and analysis system, and analysis of this data using asset model, in accordance with one or more embodiments described herein.

FIG. 10 is a diagram illustrating subsequent collection of time-series control data (e.g., time-stamped control data 1006), which can comprise operational and status data, from automation system devices by the data modeling and analysis system 202, and analysis of the time-series control data using the industrial asset model 418. In this regard, the data modeling and analysis system 202 can facilitate (e.g., via an industrial asset model 418) a variety of industrial automation data quality and analysis operations in accordance with various embodiments described herein.

For example, during operation of a corresponding industrial automation system, the device interface component 206 can collect or retrieve time-stamped control data 1006 from industrial devices that make up the automation system (e.g., industrial controllers 118, industrial devices 120, industrial devices 302 capable of applying device-level contextualization, or other such devices) and/or that are represented in the industrial asset model 418. It is noted that industrial data 416 can comprise the time-stamped control data 1006 and can further comprise timestamp data that has been generated by an industrial device herein concurrently with the time-stamped control data 1006. To improve the quality, value, and accuracy of data analysis, industrial devices (e.g., industrial devices 302) from which the time-stamped control data 1006 is obtained can be configured themselves to apply such timestamps and/or corresponding location information (e.g., physical location, slot, port, connections, etc.) to items of data generated by those industrial devices 302, indicating the time at which the data items were generated and/or the location at which the data items were generated. Such timestamps applied at the device level in this manner can more accurately reflect the time at which the corresponding data value was generated relative to relying upon higher-level data collection systems to apply timestamps to the data, since the device-level timestamps do not include lag errors that would otherwise be introduced due to the lag time between generation of the data value at the device level and receipt of the data value at a corresponding data collection system. By increasing the accuracy of the timestamps, any analyses (e.g., root cause analysis or other suitable analyses) based on the timestamps will also be more accurate. The device interface component 206 can obtain control data not only from industrial controllers (e.g., the controllers' data tables) but also from I/O devices (e.g., industrial devices 120) that are connected to the controllers' I/O, including but not limited to analog and digital sensors, telemetry devices, motor drives (e.g., variable frequency drives) proximity switches, or other such devices. The metadata component 214 can apply origination or lineage metadata to collected items of time-stamped control data 1006, including data obtained from these level 0 devices (e.g., devices that are the lowest level of the control hierarchy, such as sensors or actuators that are directly connected to the physical processes), which identifies the location of origin of the time-stamped control data 1006.

In various embodiments, the quality component 224 can determine a quality indicator applicable to the time-stamped control data 1006 or industrial data 416. This quality indicator can represent a degree of reliability of the accuracy of the industrial data 416, which can be impacted by circumstances on the plant floor of an industrial automation facility. For example, an error condition of a sensor that is part of the automation system may cause both the data generated by that sensor as well as data generated by other devices that rely upon the sensor's measurements to be less reliable or accurate relative to normal sensor operation. Accordingly, the quality component 224, the industrial device 302, or the metadata component 214 of the data modeling and analysis system 202 can apply a quality indicator to the relevant items of time-stamped control data 1006 indicating that the data has a lower level of reliability. During normal sensor operation, time-stamped control data 1006 can be assigned a quality indicator indicating high reliability. These quality indicators can be leveraged by one or more of the analytics application 1002, for instance, to improve accuracy of analytic results or to mitigate analytic results due to potentially inaccurate data (e.g., determining, by the remediation component 228, whether to implement a control countermeasure given the possibility of inaccurate data, applying labels to analytic outputs that were generated using low quality data to indicate potential inaccuracies, etc.) Such analytics applications 1002 can be industry specific, with exemplary industries comprising mining, energy management, manufacturing and assembly, pharmaceuticals, agricultural, construction, transportation, or other suitable industries. Quality labels herein can be binary in nature (e.g., conveying simple GOOD or BAD quality), or can convey a more granular degree of confidence in the data's accuracy (e.g., a 0-100% scale). In some embodiments, the quality component 224 can generate a quality score based on the quality indicator (e.g., using a defined quality score algorithm). In further embodiments, the quality component 224 can determine the quality indicator using a data quality model generated using machine learning (e.g., by the machine learning component 242) applied to past industrial data and past quality indicators.

In one or more embodiments, the metadata component 214 can apply further contextual metadata to the collected time-stamped control data 1006 to yield contextualized data 1004, which can be provided to the analytics component 204 for analysis. Analytics component 204 can apply analytics applications 1002 to the contextualized data 1004, leveraging knowledge about the automation system encoded in the industrial asset model 418 in connection with this analysis. In this regard, the analytics component 204 can generate analytical data applicable to an industrial device herein based on the timestamp data or the contextual metadata (e.g., and using a defined analytical algorithm or program). Example analytics applications 1002 can include, but are not limited to, predictive maintenance applications or algorithms, energy management or prediction applications or algorithms, batch reporting applications or algorithms, applications or algorithms capable of predicting asset failures, asset performance management application or algorithms, or other suitable applications or algorithms. Contextualizing items of the collected time-stamped control data 1006 to include a device-level timestamp, a quality or reliability indicator, and a location of origin indicator, as discussed above, yields contextualized data 1004 that can improve the accuracy and reliability of a range of analytics applied to the industrial data 416 by the analytics component 204, and can also improve the reliability of model training. At least some of this metadata can be applied based on information obtained from the industrial asset model 418. For example, the industrial asset model 418 can define communication pathways to respective data sources on the plant floor, in terms of network segments, device hierarchies, or other types of pathway segments (e.g., device lineage data). This information can be leveraged by the metadata component 214 in connection with applying origination metadata that identifies the location of origin of items of the time-stamped control data 1006.

Information contained in the industrial asset model 418 can also be leveraged in connection with writing data from the data modeling and analysis system 202 to selected devices or systems (e.g., industrial data writeback herein). For example, if a user submits a modification directed to a control parameter on an industrial controller 118, or industrial device 120 or 302, the data modeling and analysis system 202 (e.g., via the device interface component 206) can utilize the industrial asset model 418 to build a communication connection to the data source and apply the change via the connection. The industrial asset model 418 can provide pathway information in terms of the plant, network, subnet, device, I/O slot, or other communication channels to the relevant data tag. The system can track and audit such modification, including recording the initiator, date, and/or time of the data modifications. The data modeling and analysis system 202 can also leverage device location information recorded in the industrial asset model 418 to build communication paths for automated data writes to the devices.

Figure 11:
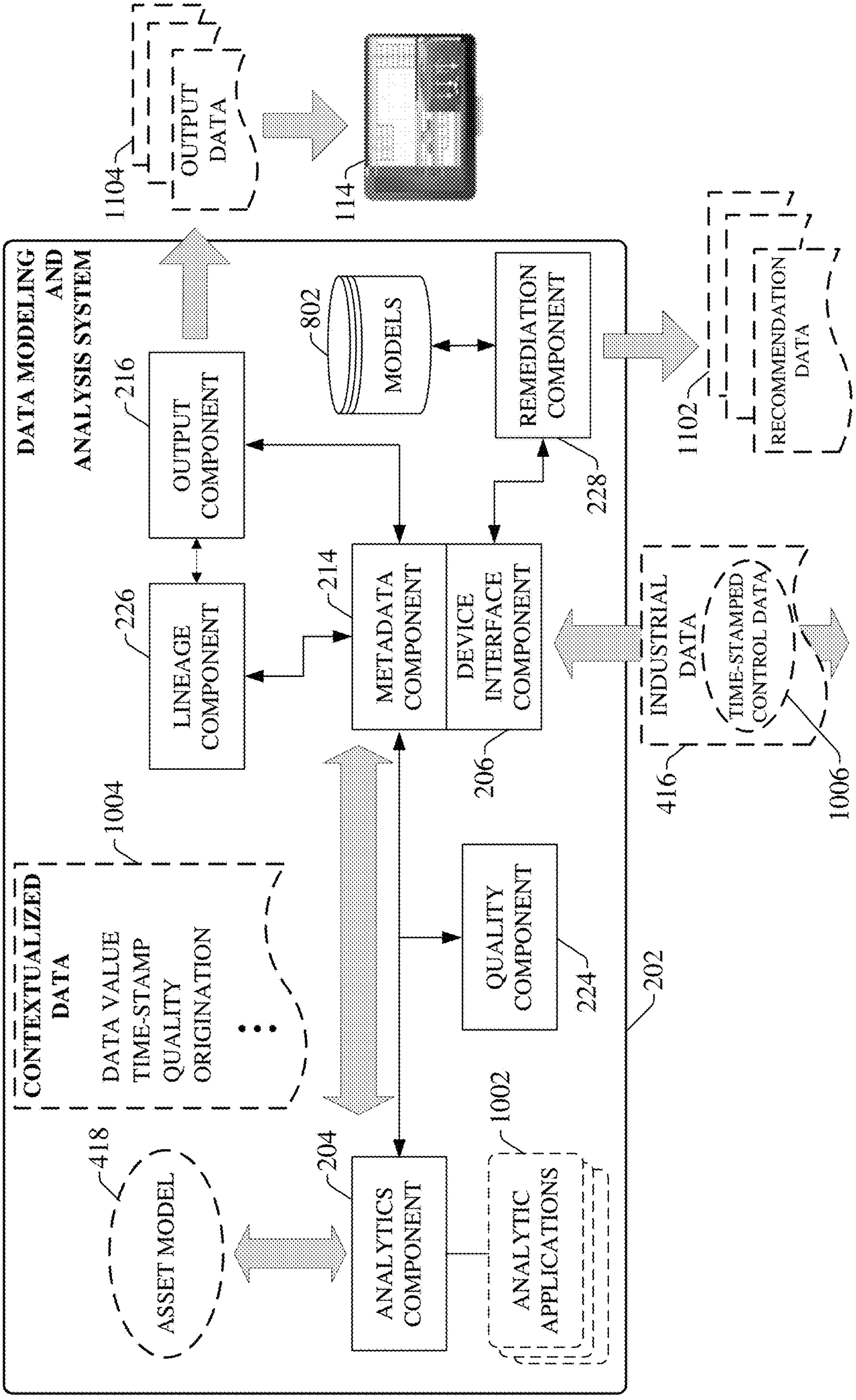
FIG. 11 is a diagram illustrating exemplary determination of data path information representative of a data path between an industrial device and an industrial asset model, in accordance with one or more embodiments described herein.

FIG. 11 is a diagram illustrating exemplary determination of data path information representative of a data path between an industrial device and an industrial asset model, and recommendation generation, in accordance with one or more embodiments described herein. As described above with respect to FIG. 10, the quality component 224 can determine a quality indicator applicable to the time-stamped control data 1006 or industrial data 416. Based on this quality indicator determined by the quality component 224, the output component 216 can generate an output (e.g., output data 1104) representative of a quality of the control data. The output data can be rendered via an HMI 114 or another suitable device. The output data 1104 can be in one or more a variety of forms, such as numeric, text, graphical, audio, video, binary, analog, control signals, or in other suitable forms. In some embodiments, the output component 216 can generate an output (e.g., output data 1104) that can be rendered via an HMI 114 or an authorized external device. In another embodiment, the lineage component 226 can determine data path information representative of a data path between the industrial device and the industrial asset model. In this regard, the output component 216 can further generate the above-described output (e.g., output data 1104) based on the aforementioned data path information. In various embodiments described herein, the industrial data 416 can comprise location data representative of a location of a corresponding industrial device. In this regard, the output component 216 can further generate the above-described output (e.g., output data 1104) based on the noted location data.

As described above with respect to FIG. 10, the quality component 224 can determine a quality indicator applicable to the time-stamped control data 1006 or industrial data 416. In this regard, the remediation component 228 can (e.g., in response to a determination that the quality indicator does not satisfy a defined data quality threshold) generate a recommendation (e.g., recommendation data 1102) applicable to the industrial device. In some embodiments, the remediation component 228 can generate the above recommendation using a remediation model that was generated (e.g., by the machine learning component 242) using machine learning based on past remedies applicable to various other industrial devices. The output component 216 can further generate an output representative of the recommendation generated by the remediation component 228, which can be rendered via an HMI 114 or another suitable device.

Figure 12:
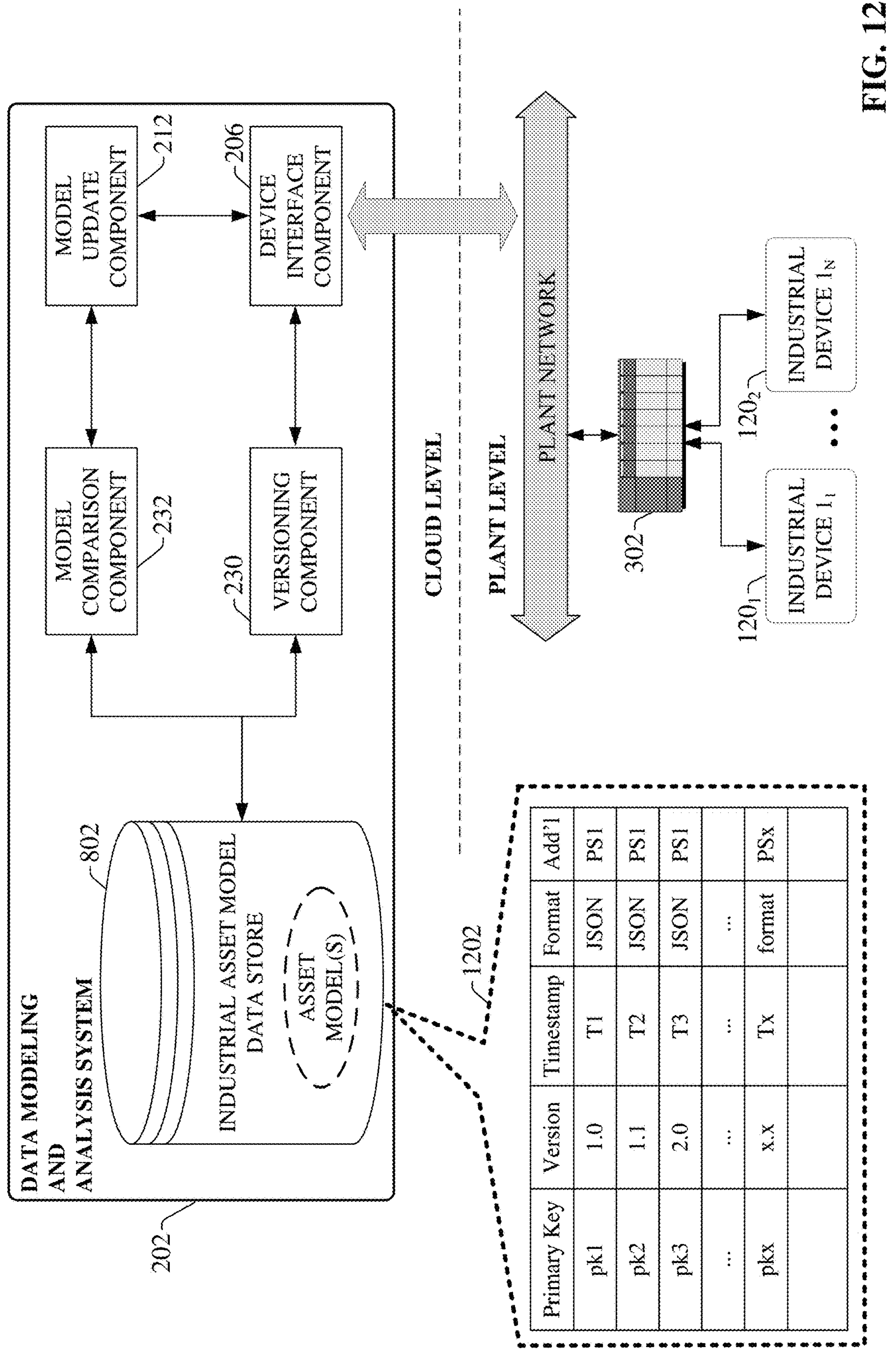
FIG. 12 is a diagram illustrating an example architecture in which the data modeling and analysis system executes on a cloud platform and facilitates industrial asset model versioning control and access in accordance with one or more embodiments described herein.

FIG. 12 is a diagram illustrating an example architecture in which the data modeling and analysis system 202 executes on a cloud platform and facilitates industrial asset model versioning control and access in accordance with one or more embodiments described herein. Such industrial asset model versioning control and access herein can facilitate access by a system herein (e.g., data modeling and analysis system 202) to a plurality of versions of the industrial asset model 418 or other suitable models. Such industrial asset models (e.g., and corresponding versions) can be stored in an industrial asset model data store 802. Further, versions of industrial asset models herein can be generated (e.g., via the model update component 212, versioning component 230, model generation component 210, or another component herein) and/or stored in the industrial asset model data store 802 in response to changes made to the industrial asset model (e.g., industrial asset model 418). For example, a new version of an industrial asset model 418 can result from a change to a PLC program or a different software or hardware change to a device represented in the industrial asset model 418. By storing multiple versions of an industrial asset model 418, comparisons (e.g., in performance, size, or based on other suitable metrics) between the versions of the industrial asset model can be facilitated. For instance, in an embodiment, the model update component 212 can, based on a change to a first version of an industrial asset model, update the industrial asset model, resulting in a second version of the industrial asset model (e.g., an updated industrial asset model). The versioning component 230 can then store the second version of the industrial asset model in an industrial asset model data store 802. In some embodiments, the change to the first version of the industrial asset model 418 can comprise a change to an industrial device represented in the industrial asset model 418. In this regard, the device interface component 206 can apply the change to the industrial device (e.g., based upon a change condition being determined to be satisfied and using the industrial asset model). In further embodiments, the change can comprise an addition of an industrial device to the industrial asset model or a removal of an industrial device from the industrial asset model. In another embodiment, the versioning component 230 can revert the industrial asset model from the second version to the first version in response to a defined revert condition being determined to be satisfied. Such a revert condition can comprise a failure or satisfaction of a defined test, an instruction (e.g., received via the communication component 222 or user interface component 208) to revert the industrial asset model 418 from the second version to the first version, the second version being determined (e.g., via the device interface component 206 or another suitable component herein) to comprise lower performance than the first version according to a defined performance metric, or another suitable revert condition.

It is noted that a plurality of industrial asset models and versions of industrial asset models, including the first version of the industrial asset model, can be stored in the industrial asset model data store 802. In various embodiments, the industrial asset model data store 802 can comprise information 1202 (e.g., metadata/contextual metadata) applicable to industrial asset models herein and corresponding versions thereof. For example, information 1202 can comprise primary key (pk) information, version information, timestamp information, format information, problem set (PS) information, or other additional information. In various implementations, the industrial asset model data store 802 can utilize a file-based approach applicable to a version control system herein. The foregoing can enable version comparison, branch control in the industrial asset model data store, version rollback capability, and other suitable functions.

In various embodiments, different models or versions of models can be applied to different problem sets. Such problem sets can comprise one or more of equipment breakdown mitigation, safety hazard reduction, efficiency improvement, environmental impact reduction, downtime reduction, or other suitable problem sets. Thus, in some embodiments, a first version of an industrial asset model 418 can be associated with a first defined problem set and a second version of the industrial asset model 418 can be associated with a second defined problem set (e.g., different from the first defined problem set). In further embodiments, the first version of the industrial asset model can comprise a first timestamp and the second version of the industrial asset model can comprise a second timestamp (e.g., different from the first timestamp). In this regard, such timestamps can be associated with time of generation of the industrial asset model 418, last update of the industrial asset model 418, data input or output with respect to the industrial asset model 418, applicable to a device represented in the industrial asset model 418, or applicable to/associated with other suitable data or metrics.

In an embodiment, the model comparison component 232 can determine a difference between the first version of the industrial asset model and the second version of the industrial asset model. In some embodiments, such a difference can comprise a difference in respective outputs between the first version of the industrial asset model and the second version of the industrial asset model. Other differences can comprise differences in file or data size, differences in performance, differences in structure, logical differences, metadata differences, differences in industrial devices represented, or other suitable differences.

Figure 13:
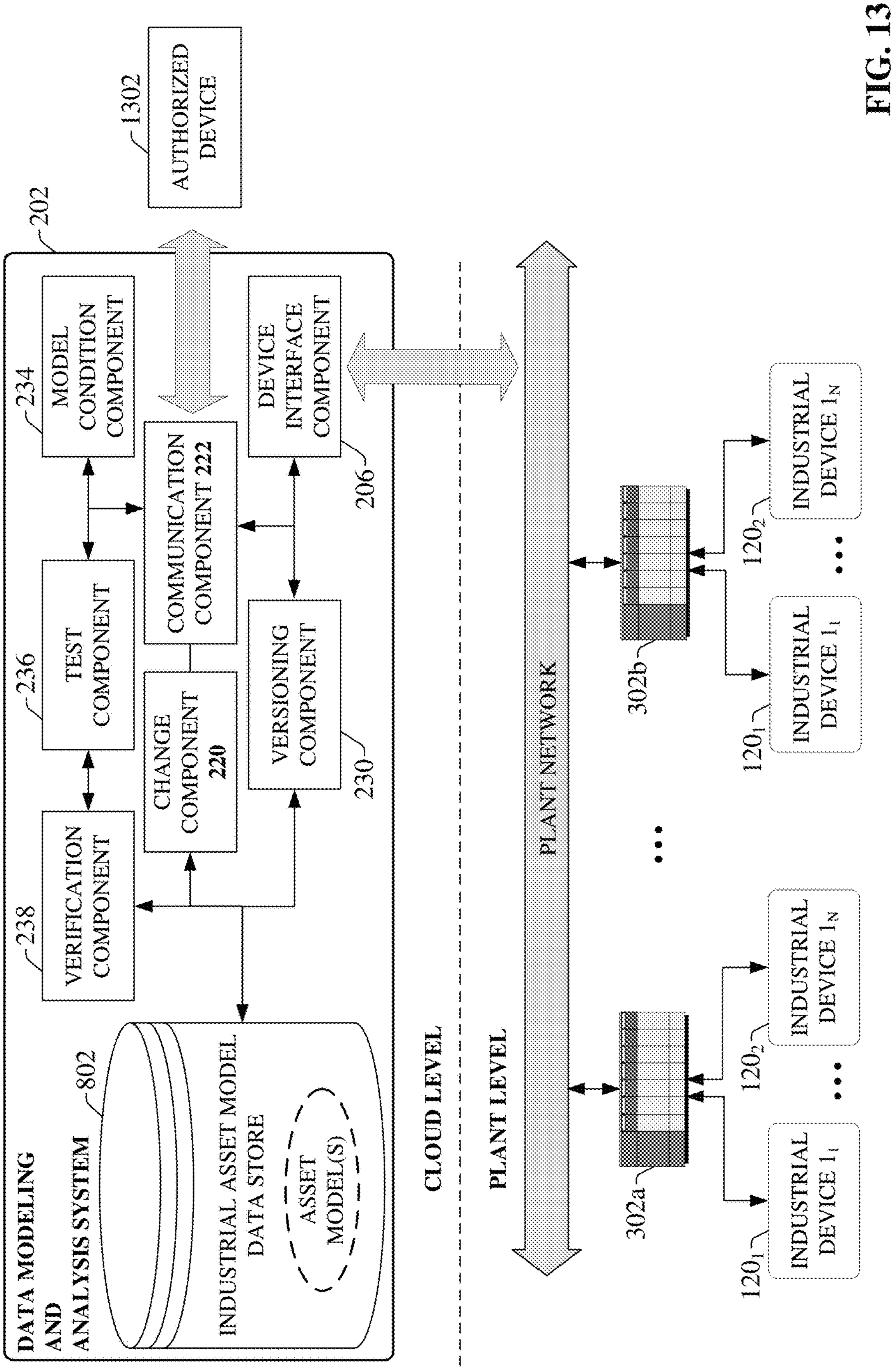
FIG. 13 is a diagram illustrating an example architecture in which the data modeling and analysis system executes on a cloud platform and facilitates industrial asset model roll-back in accordance with one or more embodiments described herein.

FIG. 13 is a diagram illustrating an example architecture in which the data modeling and analysis system 202 executes on a cloud platform and facilitates industrial asset model rollback in accordance with one or more embodiments described herein. Industrial asset model rollback capability of a system herein can enable, for instance, rapid correction of a problem with new version of an industrial asset model herein by rolling an industrial asset model back to a prior version (e.g., to a version that does not comprise the problem). By utilizing a file-based approach (e.g., JSON), rather than a data-based approach, industrial asset models herein can be rapidly rolled back (e.g., via a versioning component 230) to a prior version of the respective industrial asset model. Further, when an industrial asset model herein is changed from one version to another, the data modeling and analysis system 202 herein can further apply (e.g., via the device interface component 206) corresponding changes to respective industrial device(s) represented in the applicable industrial asset model 418 (e.g., write the change, or data representative of the change, to an industrial device represented in the industrial asset model 418 via a device interface component 206).

According to an embodiment, a model condition component 234 can determine whether a defined revert condition, applicable to an industrial asset model described herein, has been satisfied. Such a revert condition can comprise a failure of a defined test, a received instruction to revert the industrial asset model 418 from the second version to the first version, the second version being determined to comprise lower performance than the first version according to a defined performance metric, or another suitable revert condition. A versioning component 230 can then revert the industrial asset model (e.g., industrial asset model 418) from a second version of the industrial asset model to a first version of the industrial asset model (e.g., in response to the defined revert condition being determined by the model condition component 234 to be satisfied). According to an embodiment, the test component 236 can facilitate a test of the second version of the industrial asset model according to a defined asset model test. Such a defined asset model test can be configured to test performance, stability, repeatability, accuracy, precision, or other suitable metrics applicable to an industrial asset model. In this regard, a defined revert condition utilized by the versioning component 230 can comprise a failure of the aforementioned test. In various implementations, the aforementioned defined revert condition can comprise a failure of the above-noted test. In another implementation, the defined revert condition can comprise reception (e.g., via the communication component 222 or user interface component 208) of an instruction (e.g., from the authorized device 1302) to revert the industrial asset model 418 from the second version to the first version.

According to an embodiment, the device interface component 206 can (e.g., in response to a second version of the industrial asset model being determined to be reverted to the first version of the industrial asset model) apply a change to a respective industrial device. This change can correspond to a difference between the second version of the industrial asset model 418 and the first version of the industrial asset model 418, and can be applicable to the respective industrial device represented in the industrial asset model 418. In an implementation, the change component 220 can determine this change (e.g., that is applicable to the industrial device). In some embodiments, the change can be applied (e.g., via the device interface component 206) to the industrial device (e.g., via the change component 220 and/or the device interface component 206) concurrently with the reverting of the industrial asset model from the second version to the first version. In various embodiments, the verification component 238 can facilitate verification of reversion of industrial asset models herein. In this regard, the verification component 238 can verify (e.g., according to a defined verification criterion) the reverting of the industrial asset model from the second version to the first version. Such a defined change verification criterion can be based on, or utilize, hash-based data verification or checksum-based data verification, digital signature verification, error detection codes, data logs, data replication, or other suitable data change verification. In other embodiments, the verification component 238 can verify the change using a change model (e.g., that has been generated using machine learning applied to past changes to various industrial devices). In various embodiments herein, the device interface component 206 can apply the aforementioned change to the industrial device in response to the reverting of the industrial asset model from the second version to the first version being determined to be verified (e.g., by the verification component 238). It is noted that, in one or more embodiments, the aforementioned change can comprise an addition of an industrial device to the industrial asset model or a removal of an industrial device from the industrial asset model. Additionally, or alternatively, the verification component 238 can determine whether a change herein comprises an authorized change. In this regard, the verification component 238 can generate an alert if the change is not an authorized change, or can cause the device interface component 206 to facilitate reversion of the change.

Figure 14:
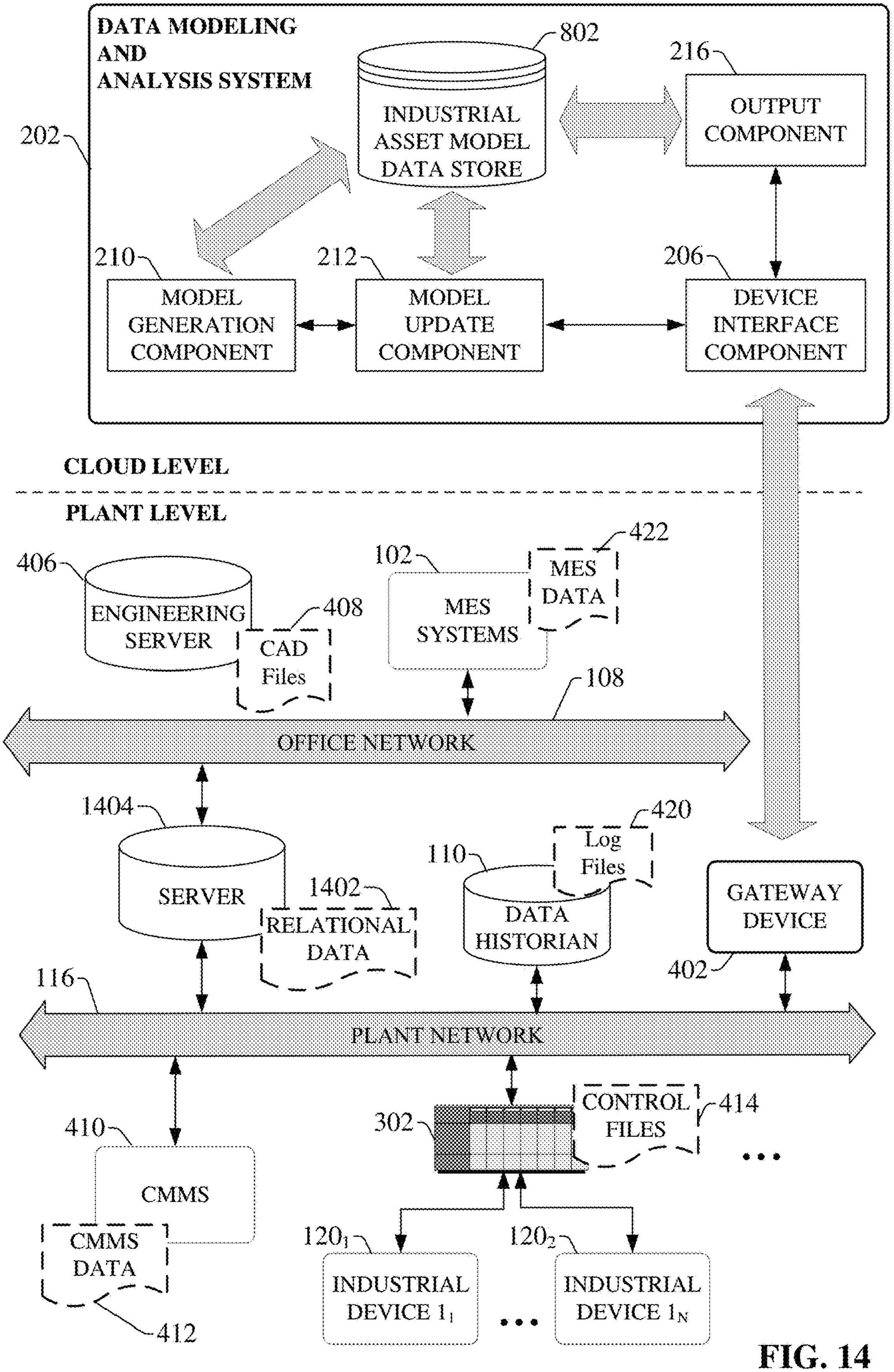
FIG. 14 is a diagram illustrating an example architecture in which the data modeling and analysis system executes on a cloud platform and facilitates industrial automation relational data extraction, connection, and mapping in accordance with one or more embodiments described herein.

FIG. 14 is a diagram illustrating an example architecture in which the data modeling and analysis system 202 executes on a cloud platform and facilitates industrial automation relational data extraction, connection, and mapping in accordance with one or more embodiments described herein. For instance, the data modeling and analysis system 202 can be configured to read a template of an industrial device herein and map the template into an industrial asset model herein, along with live and/or historical data from or applicable to the industrial device. In this regard, according to an embodiment, the device interface component 206 can match industrial relational data 1402 (e.g., stored on a server 1404 or in a different location and/or accessible via an industrial asset model) to an industrial device represented in the industrial asset model 418. In various embodiments, the device interface component 206 can retrieve the industrial relational data 1402 via a gateway device 402 communicatively coupled to the industrial device. In some embodiments, the device interface component 206 can match the industrial relational data 1402 to the industrial device using a matching model. Such a matching model can be generated (e.g., by the machine learning component 242) using machine learning based on past industrial relational data and other industrial devices (e.g., other than the instant industrial device). The industrial relational data 1402 described herein can comprise an electronic note applicable to the industrial device. In various embodiments, this electronic note can comprise maintenance data representative of a maintenance event associated with the industrial device. Such maintenance data can comprise problem data and solution data applicable to the maintenance event. For example, the problem and solution data can comprise date of maintenance, equipment or facility information, maintenance task information, maintenance personnel, corresponding parts used, maintenance schedule information, problem identification, comments, or other suitable problem and solution data. By capturing the industrial relational data 1402, the industrial asset model 418 can maintain problem and solution data associated with maintenance events or other events throughout a lifecycle of an industrial device or system.

Further, the industrial asset model 418 can extrapolate such problem and solution data to other like industrial devices.

After matching the industrial relational data 1402 to the industrial device represented in the industrial asset model 418, the device interface component 206 can next extract the industrial relational data 1402 into the industrial asset model 418. Once the industrial relational data 1402 has been extracted into the industrial asset model 418, the model update component 212 can update the industrial asset model 418 (e.g., resulting in an updated industrial asset model). It is noted that updating the industrial asset model 418 herein (e.g., via the model update component 212) can comprise associating the industrial relational data 1402 with the industrial device (e.g., industrial device 302, industrial device 120, and/or industrial controller 118). In various embodiments, the model generation component 210 can generate the industrial asset model 418 based on (1) the industrial relational data matched to the industrial device, (2) asset data representative of industrial devices, comprising the industrial device, represented in an industrial automation system herein, and/or (3) communication pathways between the industrial devices.

In various embodiments, the output component 216 can generate an output applicable to the industrial device that is representative of the updating of the industrial asset model 418 and/or the extraction of the industrial relational data 1402 into the industrial asset model 418. In this regard, the output can be based on the industrial relational data and generated using the updated industrial asset model. The output can be rendered via an HMI 114 or another suitable device. The output can be in one or more a variety of forms, such as numeric, text, graphical, audio, video, binary, analog, control signals, or in other suitable forms. In some embodiments, the output component 216 can generate an output that can be rendered via an HMI 114 or an authorized external device.

Figure 15:
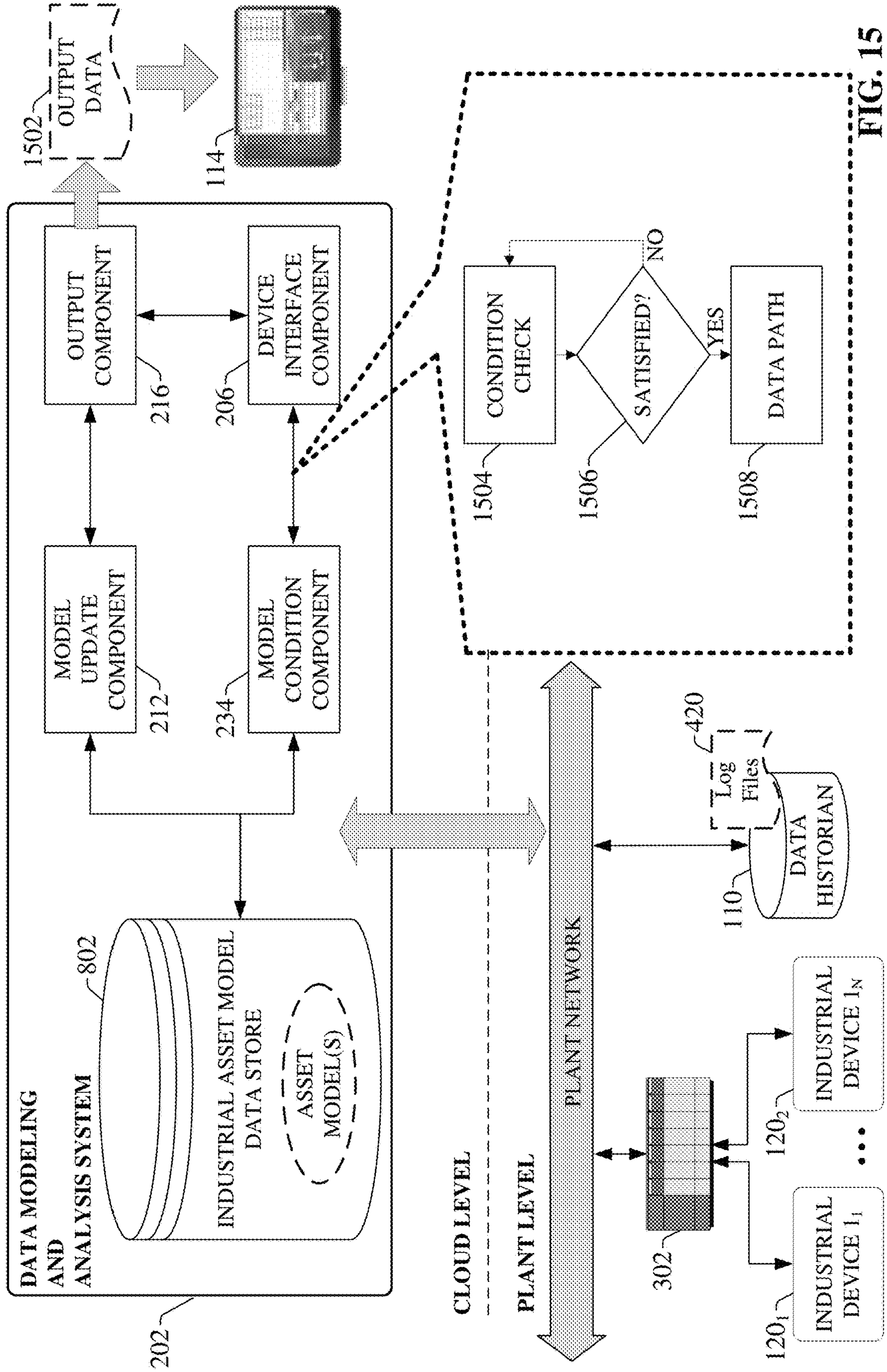
FIG. 15 is a diagram illustrating an example architecture in which the data modeling and analysis system executes on a cloud platform and facilitates conditional industrial data source connection in accordance with one or more embodiments described herein.

FIG. 15 is a diagram illustrating an example architecture in which the data modeling and analysis system 202 executes on a cloud platform and facilitates conditional industrial data source connection in accordance with one or more embodiments described herein. By utilizing conditional industrial data source connection, an industrial asset model herein can automatically connect to data sources on an as-needed basis and/or based on one or more of a variety of conditions using a top-down approach (e.g., model to data source). Such conditions can be predefined or otherwise determined (e.g., using machine learning) to optimize industrial data retrieval. For example, if industrial data herein is represented in both an industrial device herein and a data historian 110, the data historian 110 can be preferenced for data retrieval in order to minimize a computational load on the industrial device. In this regard, in an embodiment, the model condition component 234 can determine whether a defined data connection condition (e.g., a defined data connection condition that is applicable to an industrial asset model) has been satisfied (e.g., condition check 1504). According to an example, the defined data connection condition can comprise receipt of an instruction to obtain the industrial data (e.g., via a communication component 222—not depicted in FIG. 15). In another example, the defined data connection condition can comprise a determination of missing industrial data (e.g., corresponding to the industrial data 416) in the industrial asset model 418.

The device interface component 206 can then in response to the defined data connection condition being determined to be satisfied (e.g., Y at 1506), determine data path information representative of a data path to be traversed to obtain industrial data associated with the defined data connection condition and establish a data connection along the data path (e.g., data path 1508). It is noted that the data path can be determined from among a group of possible data paths. For example, the data path can be determined to comprise a minimum latency from among latencies of data paths of the group of possible data paths. In another example, the data path can be determined to minimize a computational load to an industrial device on the data path. In this regard, if a first copy of the industrial data is stored in an industrial device represented in the industrial asset model, and a second copy of the industrial data is stored in a historian device, the device interface component 206 can establish the data connection between the industrial asset model and the historian device in order to minimize the computational load to an industrial device. In some embodiments, the device interface component 206 can retrieve the industrial data (e.g., industrial data 416), using the data connection established by the device interface component 206, via a gateway device 402 (not depicted in FIG. 15) communicatively coupled to an industrial device determined to comprise the industrial data.

In various embodiments, the output component 216 can generate an output (e.g., output data 1502) based on the industrial data and/or the establishment of the data connection along the data path. The output data 1502 be indicative of the industrial data being retrieved by the device interface component 206 and/or the data connection utilized to obtain the industrial data 416. The output can be rendered via an HMI 114 or another suitable device. The output can be in one or more a variety of forms, such as numeric, text, graphical, audio, video, binary, analog, control signals, or in other suitable forms. In some embodiments, the output component 216 can generate an output that can be rendered via an HMI 114 or an authorized external device. According to an embodiment, once the data connection has been established, a model update component 212 can update the industrial asset model (e.g., resulting in an updated industrial asset model). The updated industrial asset model can thus include the data connection established by the device interface component 206. In this regard, the model update component 212 can associate the data connection with the industrial asset model 418.

Figure 16:
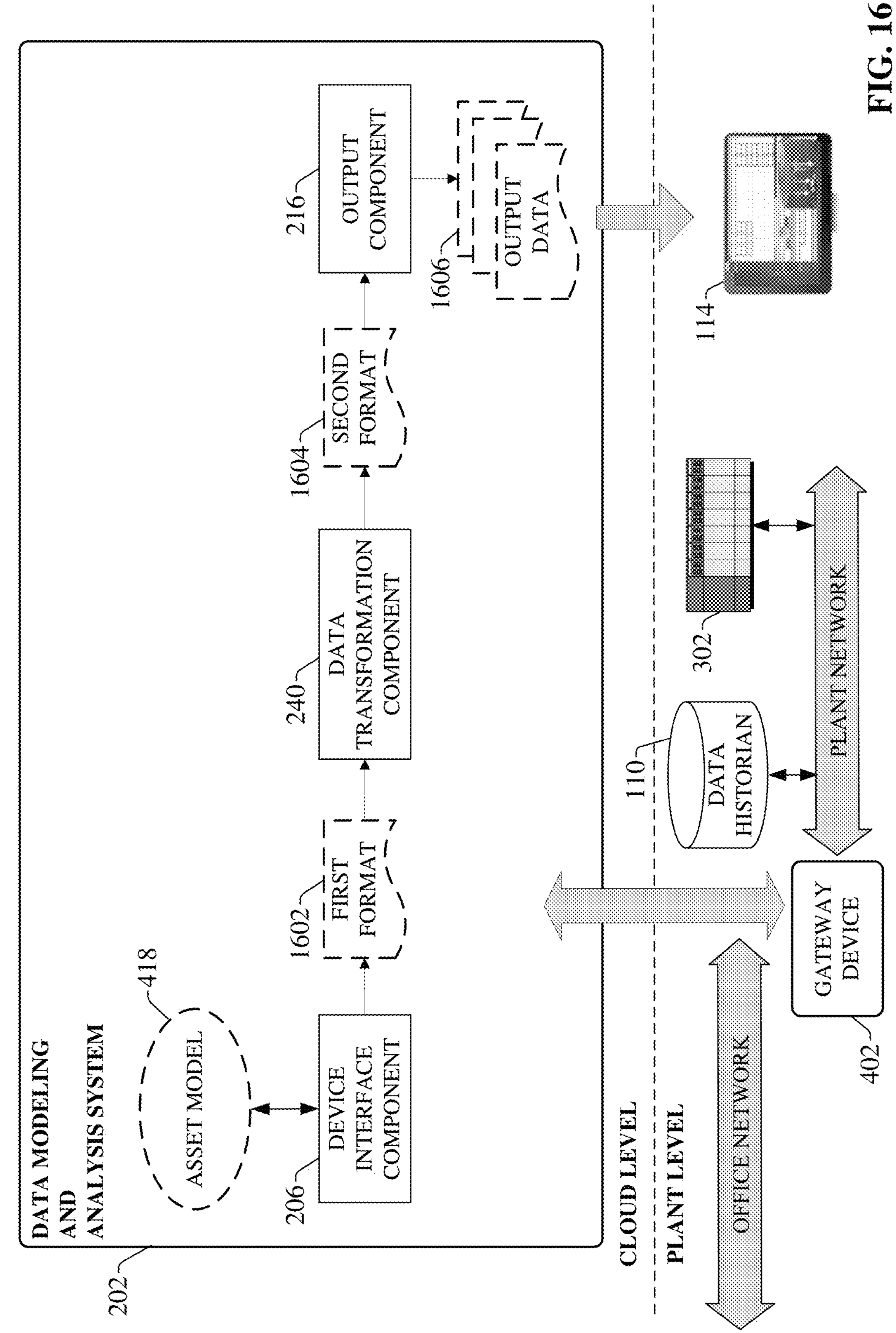
FIG. 16 is a diagram illustrating an example architecture for industrial data destination transformation in accordance with one or more embodiments described herein.

FIG. 16 is a diagram illustrating an example architecture for industrial data destination transformation in accordance with one or more embodiments described herein. An industrial data modeling and analysis system 202 can be communicatively coupled to a variety of industrial data sources, which can each utilize a variety of respective data formats. Therefore, normalization of industrial data herein can be utilized in order reduce the variety of data formats utilized in an industrial asset model 418. This can provide uniformity for use in industrial asset models herein or for other consumers of industrial data herein. Such formats can comprise one or more binary, American standard code for information interchange (ASCII), comma-separated values (CSV), JSON, Modbus, open platform communications (OPC), open platform communications unified architecture (OPC-UA), message queuing telemetry transport (MATT), PLC format, or another suitable data format. According to an embodiment, a device interface component 206 can determine a data path to be traversed to obtain industrial data. The device interface component 206 can then establish a data connection along the data path from the industrial data to an industrial asset model 418. After the data connection has been established by the device interface component 206, a data transformation component 240 can then (e.g., in response to a determination that the industrial data comprises a first data format 1602) convert the industrial data from the first data format 1602 (e.g., a data format determined not to be compatible with the industrial asset model 418) to a second data format 1604 (e.g., a data format that is compatible with the industrial asset model 418). In one or more embodiments, the device interface component 206 can provide the industrial data, in the second data format 1604 (e.g., after the aforementioned conversion from the first format to the second format), to the industrial asset model 418. In some embodiments, a first copy of the industrial data, in the first data format 1602, can be stored in a data historian 110 and a second copy of the industrial data, in the second data format 1604, can be stored in an industrial device represented in the industrial asset model 418. In this regard, the device interface component 206 can establish the data connection between the industrial asset model 418 and the data historian 110 in order to minimize a computational load on the industrial device.

In various embodiments, the output component 216 can generate an output (e.g., output data 1606) indicative of the conversion of the industrial data from the first data format 1602 to the second data format 1604. In other embodiments, the output data 1606 can comprise the industrial data in the second data format 1604 and/or in the first data format 1602. The output data 1606 can be rendered via an HMI 114 or another suitable device. The output data 1606 can be in one or more a variety of forms, such as numeric, text, graphical, audio, video, binary, analog, control signals, or in other suitable forms. In some embodiments, the output data 1606 can be rendered via an HMI 114 or an authorized external device.

Figure 17:
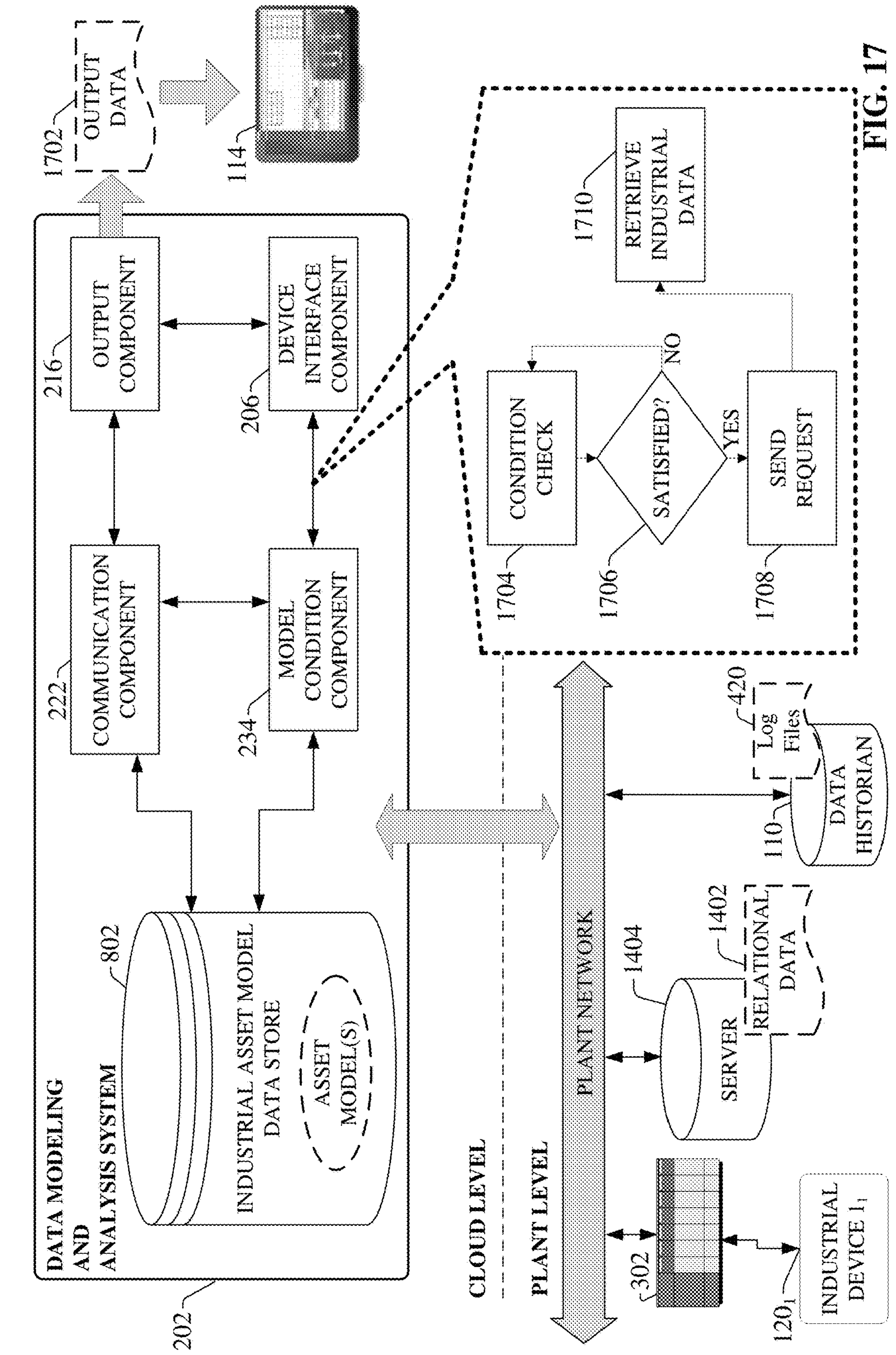
FIG. 17 is a diagram illustrating an example architecture in which the data modeling and analysis system executes on a cloud platform and facilitates industrial automation data staging and transformation in accordance with one or more embodiments described herein.

FIG. 17 is a diagram illustrating an example architecture in which the data modeling and analysis system 202 executes on a cloud platform and facilitates industrial automation data staging and transformation in accordance with one or more embodiments described herein. Such industrial automation data staging and transformation can be associated with edge computing of industrial data herein. In this regard, a system herein (e.g., data modeling and analysis system 202) can receive or retrieve normalized industrial data without additional data processing required to normalize a format of the industrial data. Such edge devices 404 can comprise industrial devices themselves, facilitating data conversion prior to providing industrial data to an industrial asset model 418, or other edge devices communicatively coupled to the industrial device. Conversion by such edge devices 404 can occur at defined intervals or at random intervals. By utilizing the edge device 404 an amount of data that needs to be transmitted to the data modeling and analysis system 202 can be reduced, latency can be decreased, and/or speed of data analysis by the data modeling and analysis system 202 can be increased. According to an embodiment, a model condition component 234 can determine whether a defined data connection condition (e.g., a defined data connection applicable to an industrial asset model) has been satisfied (e.g., condition check 1704). According to an example, the defined data connection condition can comprise receipt of an instruction to obtain the industrial data (e.g., via communication component 222 or via user interface component 208). In another example, the defined data connection condition can comprise a determination (e.g., via the device interface component 206) of missing industrial data (e.g., corresponding to the industrial data) in the industrial asset model 418. The device interface component 206 can then, in response to the defined data connection condition being determined to be satisfied (e.g., Y at 1706), determine an industrial data source that comprises industrial data 416 associated with the defined data connection condition. The device interface component 206 can send a request to the industrial data source (e.g., that is determined to comprise the industrial data 416). The request to the industrial data source can comprise a request to provide the industrial data 416 in a second data format determined to be compatible with the industrial asset model (e.g., send request 1708). The device interface component 206 can further retrieve the industrial data from the industrial data source (e.g., retrieve industrial data 1710). In this regard, the industrial data can be directly converted by the industrial data source from a first data format (e.g., a data format not compatible with the industrial device) to the second data format (e.g., a data format compatible with the industrial device). In some embodiments, the industrial data source can comprise an industrial device (e.g., industrial device 302, industrial device 120, and/or industrial controller 118) represented in the industrial asset model 418. In further embodiments, the industrial data source can comprise a data historian 110 communicatively coupled to the industrial asset model 418. In additional embodiments, the device interface component 206 can further provide the industrial data 416 to the industrial asset model 418 in the second data format.

According to an embodiment, the device interface component 206 can further retrieve industrial relational data 1402 (e.g., applicable to the industrial data source) in addition to the industrial data 416. As discussed above, such industrial relational data 1402 can comprise maintenance data (e.g., problem data and solution data applicable) representative of a maintenance event associated with the industrial data source. Such maintenance data can comprise problem data and solution data applicable to the maintenance event. For example, the problem and solution data can comprise date of maintenance, equipment or facility information, maintenance task information, maintenance personnel, corresponding parts used, maintenance schedule information, problem identification, comments, or other suitable problem and solution data. By capturing the industrial relational data 1402, the industrial asset model 418 can maintain problem and solution data associated with maintenance events or other events throughout a lifecycle of an industrial device or system. Further, the industrial asset model 418 can extrapolate such problem and solution data to other like industrial devices.

In various embodiments, the output component 216 can generate an output (e.g., output data 1702) indicative of retrieval of the industrial data 416. The output data 1702 can be rendered via an HMI 114 or another suitable device. The output data 1702 can be in one or more a variety of forms, such as numeric, text, graphical, audio, video, binary, analog, control signals, or in other suitable forms. In some embodiments, the output data 1702 can be rendered via an HMI 114 or an authorized external device.

Embodiments, systems, and components described herein, as well as control systems and automation environments in which various aspects set forth in the subject specification can be carried out, can include computer or network components such as servers, clients, programmable logic controllers (PLCs), automation controllers, communications modules, mobile computers, on-board computers for mobile vehicles, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including DeviceNet, ControlNet, safety networks, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 18:
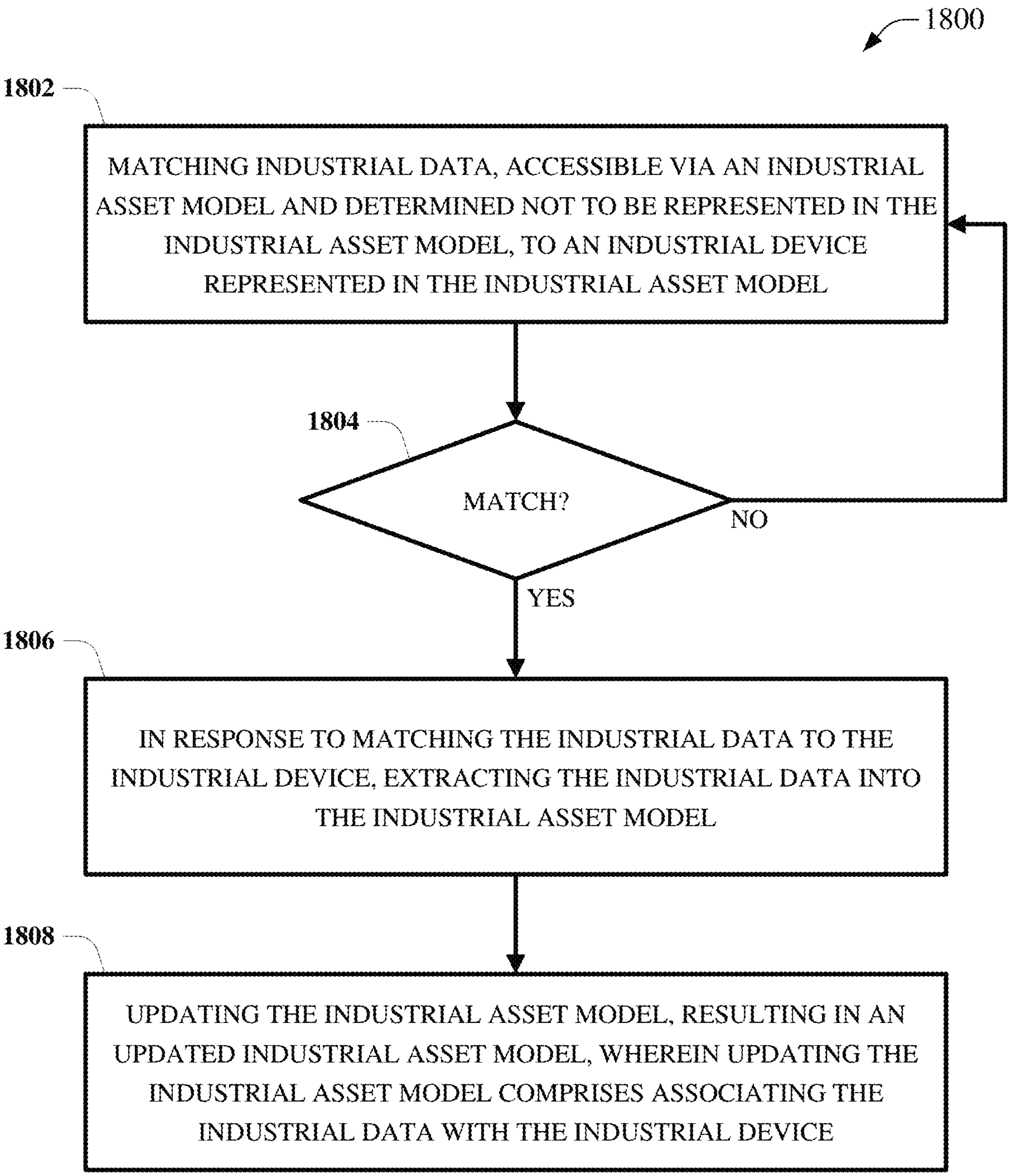
FIG. 18 is a block flow diagram for a process associated with industrial data extraction in accordance with one or more embodiments described herein.

FIG. 18 is a block flow diagram for a process 1800 associated with industrial data extraction in accordance with one or more embodiments described herein. At 1802, the process 1800 can comprise matching (e.g., via a device interface component 206) industrial data 416, accessible via an industrial asset model 418 and determined not to be represented in the industrial asset model 418, to an industrial device (e.g., industrial controller 118, industrial device 120, and/or industrial device 302) represented in the industrial asset model 418. At 1804, if a match exists, the process 1800 can proceed to 1806. Otherwise, the process can return to 1802. At 1806, the process 1800 can comprise, in response to matching the industrial data 416 to the industrial device, extracting (e.g., by the device interface component 206) the industrial data 416 into the industrial asset model 418. At 1808, the process 1800 can comprise updating (e.g., by the model update component 212) the industrial asset model 418, resulting in an updated industrial asset model, wherein updating the industrial asset model comprises associating the industrial data 416 with the industrial device (e.g., industrial controller 118, industrial device 120, and/or industrial device 302).

Figure 19:
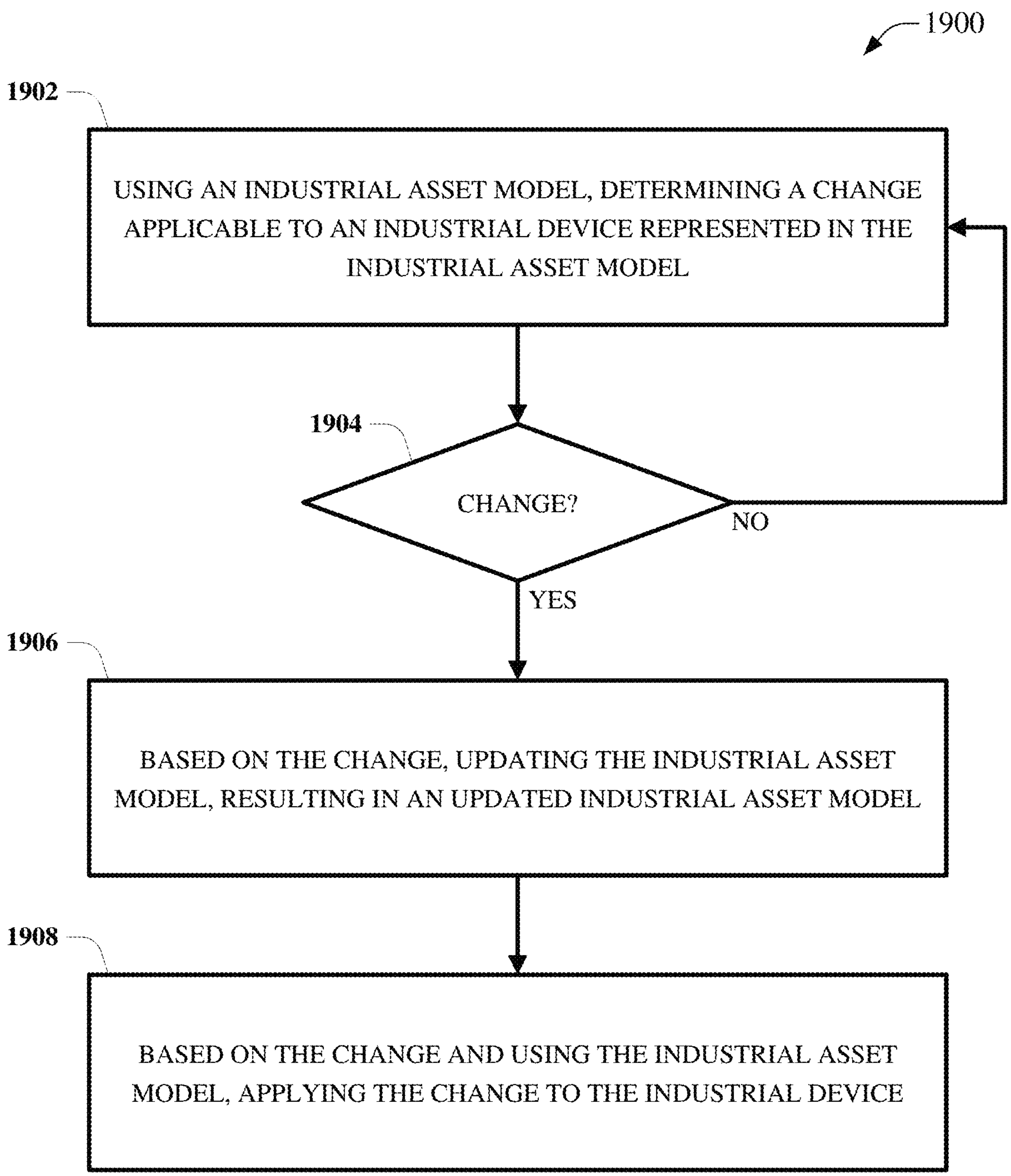
FIG. 19 is a block flow diagram for a process associated with industrial data source writeback in accordance with one or more embodiments described herein.

FIG. 19 is a block flow diagram for a process 1900 associated with industrial data source writeback in accordance with one or more embodiments described herein. At 1902, the process 1900 can comprise, using an industrial asset model 418, determining (e.g., by a change component 220) a change applicable to an industrial device represented in the industrial asset model 418. At 1904, if a change exists, the process 1900 can proceed to 1906. Otherwise, the process can return to 1902. At 1906, the process 1900 can comprise, based on the change, updating (e.g., by the model update component 212) the industrial asset model 418, resulting in an updated industrial asset model. At 1908, the process 1900 can comprise, based on the change and using the industrial asset model 418, applying (e.g., by a device interface component 206) the change to the industrial device.

FIG. 20 is a block flow diagram for a process 2000 associated with industrial automation data quality and analysis in accordance with one or more embodiments described herein. At 2002, the process 200 can comprise retrieving (e.g., by a device interface component 206) industrial data 416 from an industrial device represented in an industrial asset model 418, wherein the industrial data 416 comprises control data applicable to the industrial device and timestamp data generated by the industrial device concurrently with the control data. At 2004, the process 200 can comprise, based on the control data and the timestamp data, determining (e.g., by a quality component 224) a quality indicator applicable to the control data. At 2006, the process 2000 can comprise, based on the quality indicator, generating (e.g., by an output component 216) an output representative of a quality of the control data.

Figure 21:
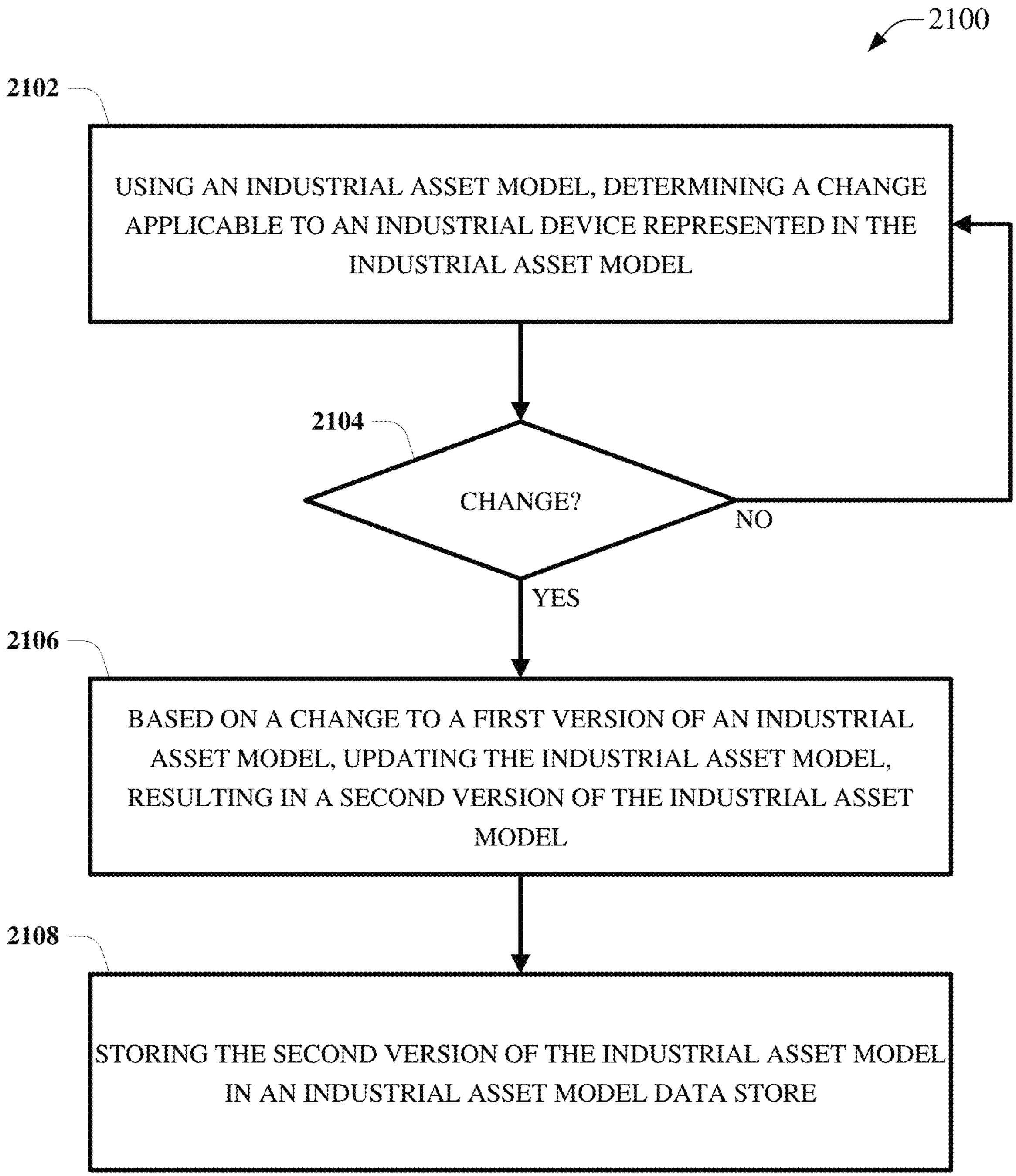
FIG. 21 is a block flow diagram for a process associated with industrial asset model versioning control and access in accordance with one or more embodiments described herein.

FIG. 21 is a block flow diagram for a process 2100 associated with industrial asset model versioning control and access in accordance with one or more embodiments described herein. At 2102, the process 2100 can comprise, using an industrial asset model 418, determining (e.g., by a change component 220) a change applicable to an industrial device represented in the industrial asset model 418. At 2104, if a change exists, the process 2100 can proceed to 2106. Otherwise, the process can return to 2102. At 2106, the process 2100 can comprise, based on a change to a first version of an industrial asset model 418, updating (by the model update component 212) the industrial asset model, resulting in a second version of the industrial asset model 418. At 2108, the process 2100 can comprise storing the second version of the industrial asset model 418 in an industrial asset model data store 802.

Figure 22:
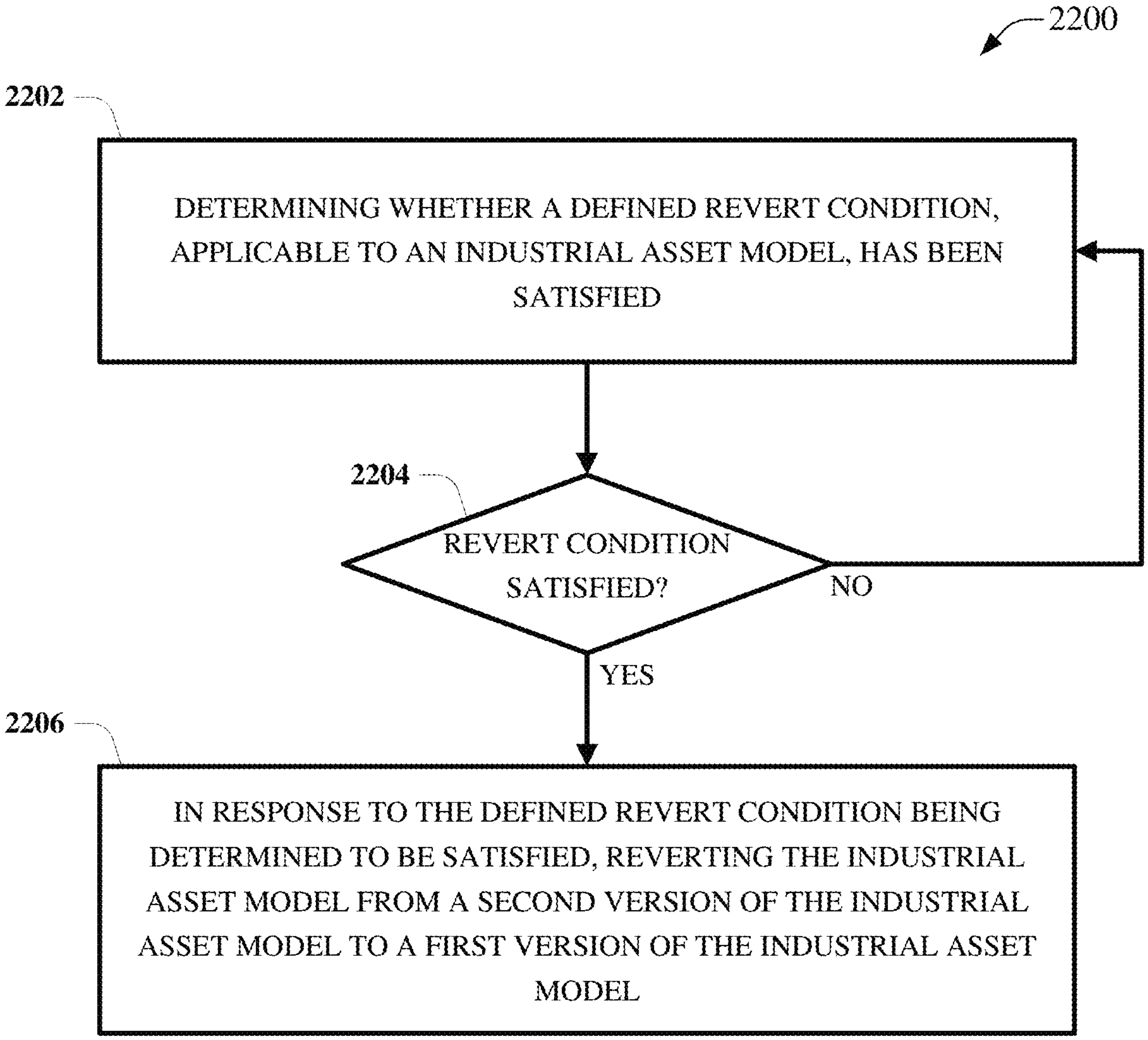
FIG. 22 is a block flow diagram for a process associated with industrial asset model rollback in accordance with one or more embodiments described herein.

FIG. 22 is a block flow diagram for a process 2200 associated with industrial asset model rollback in accordance with one or more embodiments described herein. At 2202, the process 2200 can comprise determining (e.g., by a model condition component 234) whether a defined revert condition, applicable to an industrial asset model 418, has been satisfied. At 2204, if the defined revert condition is satisfied, the process 2200 can proceed to 2206. Otherwise, the process can return to 2202. At 2206, the process 2200 can comprise, in response to the defined revert condition being determined (e.g., by the model condition component 234) to be satisfied, reverting (e.g., by a versioning component 230) the industrial asset model 418 from a second version of the industrial asset model 418 to a first version of the industrial asset model 418.

FIG. 23 is a block flow diagram for a process 2300 associated with industrial automation relational data extraction, connection, and mapping in accordance with one or more embodiments described herein. At 2302, the process 2300 can comprise matching (e.g., by a device interface component 206) industrial relational data 1402, accessible via an industrial asset model 418, to an industrial device represented in the industrial asset model 418. At 2304, the process 2300 can comprise, in response to matching (e.g., by the device interface component 206) the industrial relational data 1402 to the industrial device, extracting (e.g., by the device interface component 206) the industrial relational data into the industrial asset model 418. At 2306, the process 2300 can comprise updating (e.g., by a model update component 212) the industrial asset model 418, resulting in an updated industrial asset model, wherein updating the industrial asset model 418 comprises associating the industrial relational data 1402 with the industrial device.

Figure 24:
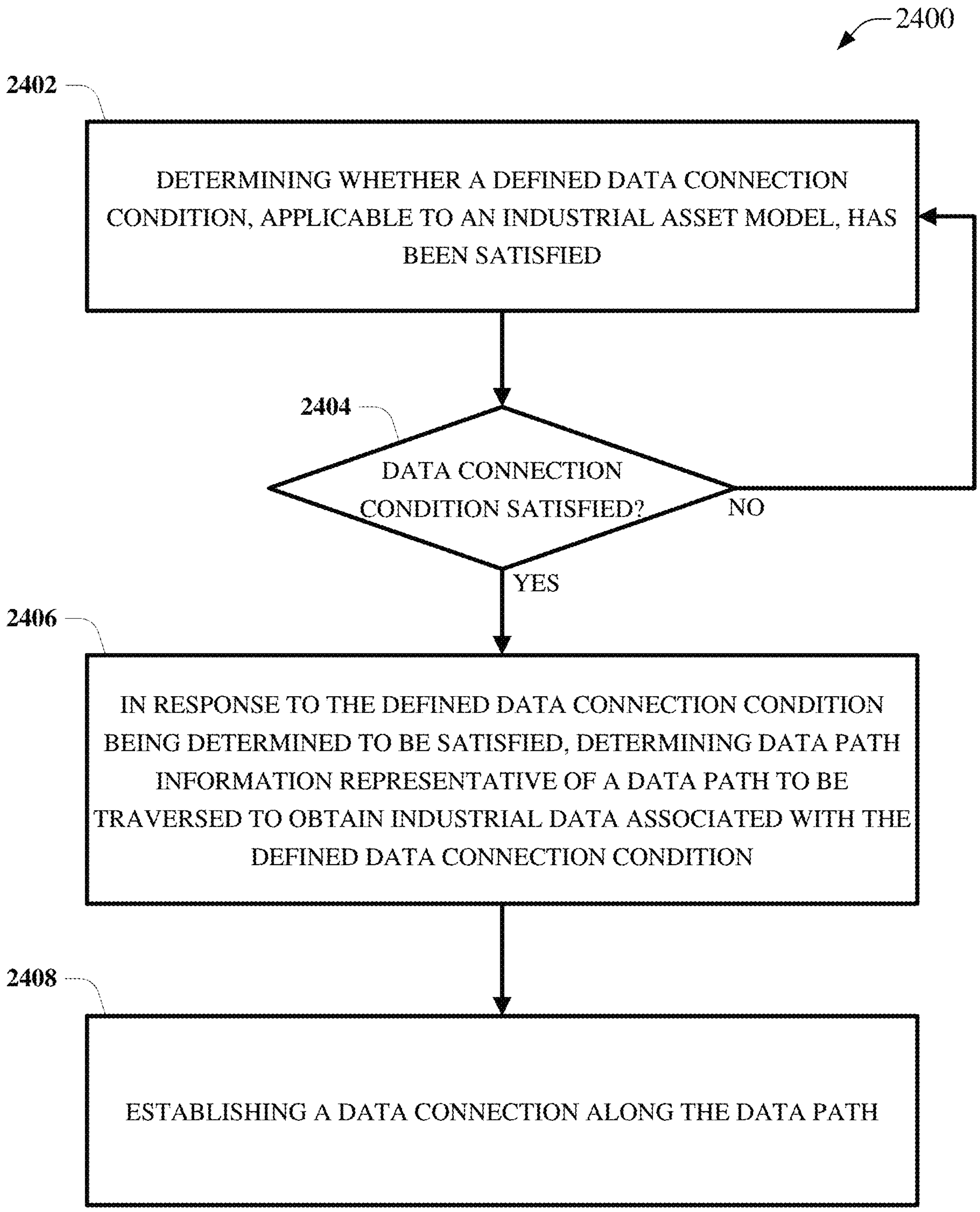
FIG. 24 is a block flow diagram for a process associated with conditional industrial data source connection in accordance with one or more embodiments described herein.

FIG. 24 is a block flow diagram for a process 2400 associated with conditional industrial data source connection in accordance with one or more embodiments described herein. At 2402, the process 2400 can comprise determining (e.g., by a model condition component 234) whether a defined data connection condition, applicable to an industrial asset model 418, has been satisfied. At 2404, if the data connection condition is satisfied, the process 2400 can proceed to 2406. Otherwise, the process can return to 2402. At 2406, the process 2400 can comprise, in response to the defined data connection condition being determined to be satisfied (e.g., by the model condition component 234), determining (e.g., by a device interface component 206) data path information representative of a data path to be traversed to obtain industrial data 416 associated with the defined data connection condition. At 2408, the process 2400 can comprise establishing (e.g., by the device interface component 206) a data connection along the data path.

FIG. 25 is a block flow diagram for a process 2500 associated with industrial data destination transformation in accordance with one or more embodiments described herein. At 2502, the process 2500 can comprise, in response to determining a data path to be traversed to obtain industrial data 416, establishing (e.g., by a device interface component 206) a data connection along the data path from the industrial data 416 to an industrial asset model 418. At 2504, the process 2500 can comprise, in response to a determination that the industrial data comprises a first data format, converting (e.g., by a data transformation component 240) the industrial data 416 from the first data format to a second data format, wherein the second data format is compatible with the industrial asset model 418.

Figure 26:
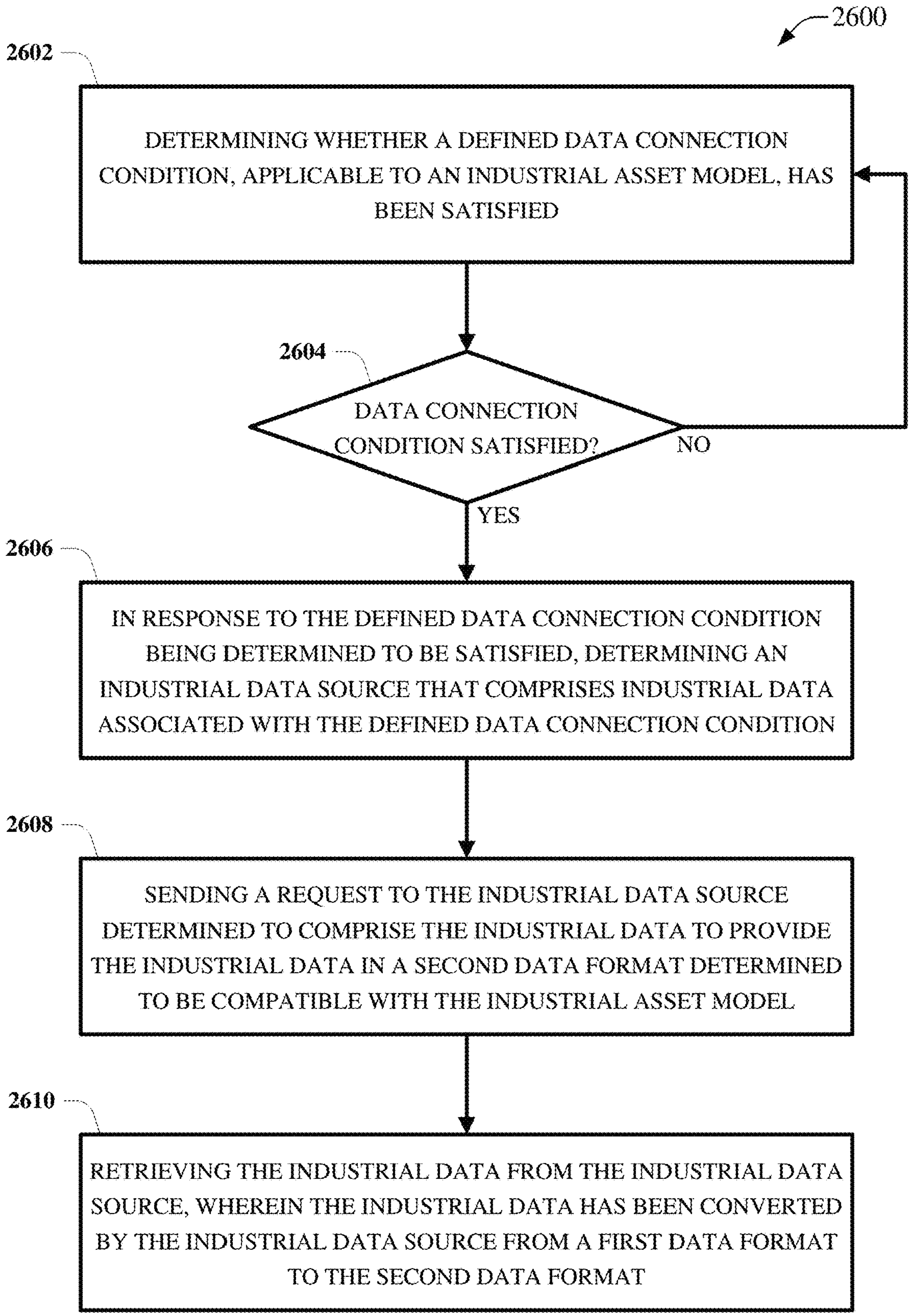
FIG. 26 is a block flow diagram for a process associated with industrial automation data staging and transformation in accordance with one or more embodiments described herein.

FIG. 26 is a block flow diagram for a process 2600 associated with industrial automation data staging and transformation in accordance with one or more embodiments described herein. At 2602, the process 2600 can comprise determining (e.g., by a model condition component 234) whether a defined data connection condition, applicable to an industrial asset model 418, has been satisfied. At 2604, if the data connection condition is satisfied, the process 2600 can proceed to 2606. Otherwise, the process can return to 2602. At 2606, the process 2600 can comprise, in response to the defined data connection condition being determined (e.g., by the model condition component 234) to be satisfied, determining (e.g., by a device interface component 206) an industrial data source that comprises industrial data 416 associated with the defined data connection condition. At 2608, the process 2600 can comprise sending (e.g., by the device interface component 206) a request to the industrial data source determined (e.g., by the device interface component 206) to comprise the industrial data 416 to provide the industrial data 416 in a second data format determined (e.g., by the device interface component 206) to be compatible with the industrial asset model 418. At 2610, the process 2600 can comprise retrieving (e.g., by the device interface component 206) the industrial data 416 from the industrial data source, wherein the industrial data 416 has been converted by the industrial data source from a first data format to the second data format.

Figure 27:
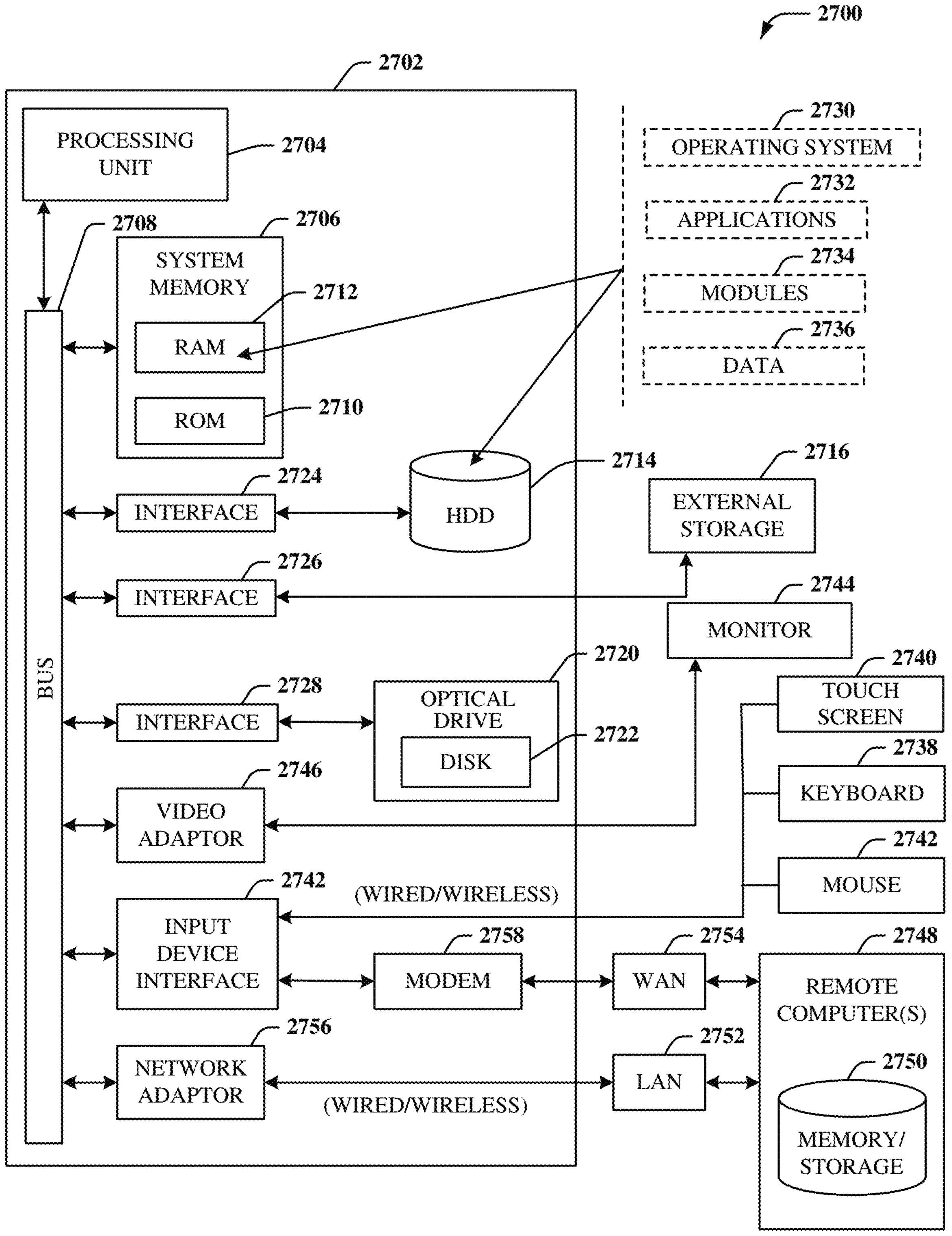
FIG. 27 is an example computing environment in accordance with one or more embodiments described herein.
Figure 28:
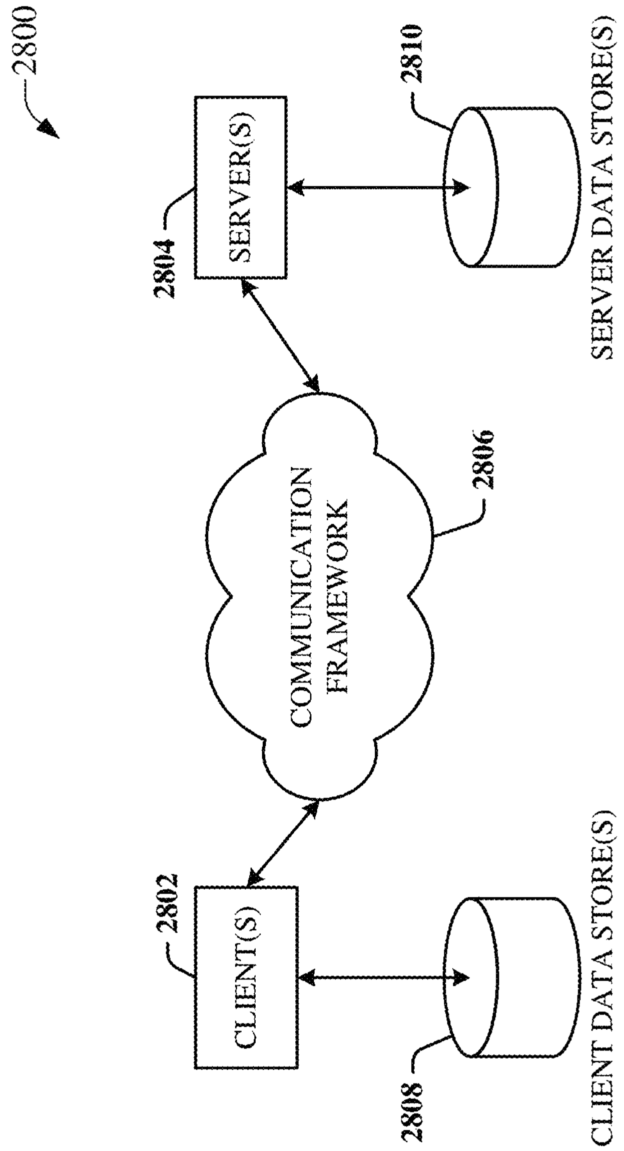
FIG. 28 is an example networking environment in accordance with one or more embodiments described herein.

In order to provide a context for the various aspects of the disclosed subject matter, FIGS. 27 and 28, as well as the following discussion, are intended to provide a brief, general description of a suitable environment in which the various aspects of the disclosed subject matter may be implemented.

While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data, or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory, or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 27, the example environment 2700 for implementing various embodiments of the aspects described herein includes a computer 2702, the computer 2702 including a processing unit 2704, a system memory 2706 and a system bus 2708. The system bus 2708 couples system components including, but not limited to, the system memory 2706 to the processing unit 2704. The processing unit 2704 can be any of various commercially available processors. Dual microprocessors and other multi-processor architectures can also be employed as the processing unit 2704.

The system bus 2708 can be any of several types of bus structure that can further interconnect to a memory bus (with or without a memory controller), a peripheral bus, and a local bus using any of a variety of commercially available bus architectures. The system memory 2706 includes ROM 2710 and RAM 2712. A basic input/output system (BIOS) can be stored in a nonvolatile memory such as ROM, erasable programmable read only memory (EPROM), EEPROM, which BIOS contains the basic routines that help to transfer information between elements within the computer 2702, such as during startup. The RAM 2712 can also include a high-speed RAM such as static RAM for caching data.

The computer 2702 further includes an internal hard disk drive (HDD) 2714 (e.g., EIDE, SATA), one or more external storage devices 2716 (e.g., a magnetic floppy disk drive (FDD) 2716, a memory stick or flash drive reader, a memory card reader, etc.) and an optical disk drive 2720 (e.g., which can read or write from a CD-ROM disc, a DVD, a BD, etc.). While the internal HDD 2714 is illustrated as located within the computer 2702, the internal HDD 2714 can also be configured for external use in a suitable chassis (not shown). Additionally, while not shown in environment 2700, a solid state drive (SSD) could be used in addition to, or in place of, an HDD 2714. The HDD 2714, external storage device(s) 2716 and optical disk drive 2720 can be connected to the system bus 2708 by an HDD interface 2724, an external storage interface 2726 and an optical drive interface 2728, respectively. The interface 2724 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2702, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 2712, including an operating system 2730, one or more application programs 2732, other program modules 2734 and program data 2736. All or portions of the operating system, applications, modules, and/or data can also be cached in the RAM 2712. The systems and methods described herein can be implemented utilizing various commercially available operating systems or combinations of operating systems.

Computer 2702 can optionally comprise emulation technologies. For example, a hypervisor (not shown) or other intermediary can emulate a hardware environment for operating system 2730, and the emulated hardware can optionally be different from the hardware illustrated in FIG. 27. In such an embodiment, operating system 2730 can comprise one virtual machine (VM) of multiple VMs hosted at computer 2702. Furthermore, operating system 2730 can provide runtime environments, such as the Java runtime environment or the .NET framework, for application programs 2732. Runtime environments are consistent execution environments that allow application programs 2732 to run on any operating system that includes the runtime environment. Similarly, operating system 2730 can support containers, and application programs 2732 can be in the form of containers, which are lightweight, standalone, executable packages of software that include, e.g., code, runtime, system tools, system libraries and settings for an application.

Further, computer 2702 can be enable with a security module, such as a trusted processing module (TPM). For instance, with a TPM, boot components hash next in time boot components, and wait for a match of results to secured values, before loading a next boot component. This process can take place at any layer in the code execution stack of computer 2702, e.g., applied at the application execution level or at the operating system (OS) kernel level, thereby enabling security at any level of code execution.

A user can enter commands and information into the computer 2702 through one or more wired/wireless input devices, e.g., a keyboard 2738, a touch screen 2740, and a pointing device, such as a mouse 2742. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 2704 through an input device interface 2744 that can be coupled to the system bus 2708, but can be connected by other interfaces, such as a parallel port, an IEEE 1394 serial port, a game port, a USB port, an IR interface, a BLUETOOTH® interface, etc.

A monitor 2744 or other type of display device can be also connected to the system bus 2708 via an interface, such as a video adapter 2748. In addition to the monitor 2744, a computer typically includes other peripheral output devices (not shown), such as speakers, printers, etc.

The computer 2702 can operate in a networked environment using logical connections via wired and/or wireless communications to one or more remote computers, such as a remote computer(s) 2748. The remote computer(s) 2748 can be a workstation, a server computer, a router, a personal computer, portable computer, microprocessor-based entertainment appliance, a peer device or other common network node, and typically includes many or all of the elements described relative to the computer 2702, although, for purposes of brevity, only a memory/storage device 2750 is illustrated. The logical connections depicted include wired/wireless connectivity to a local area network (LAN) 2752 and/or larger networks, e.g., a wide area network (WAN) 2754. Such LAN and WAN networking environments are commonplace in offices and companies, and facilitate enterprise-wide computer networks, such as intranets, all of which can connect to a global communications network, e.g., the Internet.

When used in a LAN networking environment, the computer 2702 can be connected to the local network 2752 through a wired and/or wireless communication network interface or adapter 2756. The adapter 2756 can facilitate wired or wireless communication to the LAN 2752, which can also include a wireless access point (AP) disposed thereon for communicating with the adapter 2756 in a wireless mode.

When used in a WAN networking environment, the computer 2702 can include a modem 2758 or can be connected to a communications server on the WAN 2754 via other means for establishing communications over the WAN 2754, such as by way of the Internet. The modem 2758, which can be internal or external and a wired or wireless device, can be connected to the system bus 2708 via the input device interface 2742. In a networked environment, program modules depicted relative to the computer 2702 or portions thereof, can be stored in the remote memory/storage device 2750. It will be appreciated that the network connections shown are example and other means of establishing a communications link between the computers can be used.

When used in either a LAN or WAN networking environment, the computer 2702 can access cloud storage systems or other network-based storage systems in addition to, or in place of, external storage devices 2716 as described above. Generally, a connection between the computer 2702 and a cloud storage system can be established over a LAN 2752 or WAN 2754 e.g., by the adapter 2756 or modem 2758, respectively. Upon connecting the computer 2702 to an associated cloud storage system, the external storage interface 2726 can, with the aid of the adapter 2756 and/or modem 2758, manage storage provided by the cloud storage system as it would other types of external storage. For instance, the external storage interface 2726 can be configured to provide access to cloud storage sources as if those sources were physically connected to the computer 2702.

The computer 2702 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

FIG. 28 is a schematic block diagram of a sample computing environment 2800 with which the disclosed subject matter can interact. The sample computing environment 2800 includes one or more client(s) 2802. The client(s) 2802 can be hardware and/or software (e.g., threads, processes, computing devices). The sample computing environment 2800 also includes one or more server(s) 2804. The server(s) 2804 can also be hardware and/or software (e.g., threads, processes, computing devices). The servers 2804 can house threads to perform transformations by employing one or more embodiments as described herein, for example. One possible communication between a client 2802 and servers 2804 can be in the form of a data packet adapted to be transmitted between two or more computer processes. The sample computing environment 2800 includes a communication framework 2806 that can be employed to facilitate communications between the client(s) 2802 and the server(s) 2804. The client(s) 2802 are operably connected to one or more client data store(s) 2808 that can be employed to store information local to the client(s) 2802. Similarly, the server(s) 2804 are operably connected to one or more server data store(s) 2810 that can be employed to store information local to the servers 2804.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A system, comprising:
at least one memory that stores executable components; and
at least one processor, operatively coupled to the at least one memory, that executes the executable components, the executable components comprising:
a device interface component that,
matches industrial data, accessible via an industrial asset model and determined not to be represented in the industrial asset model, to an industrial device represented in the industrial asset model, and
in response to determining a data path to be traversed to obtain the industrial data from the industrial device, establishes a data connection along the data path from the industrial data to the industrial asset model, wherein the data path has been determined to minimize respective computational loads on respective devices on the data path;
a data transformation component that, in response to a determination that the industrial data comprises a first data format, converts the industrial data from the first data format to a second data format, wherein the second data format is compatible with the industrial asset model; and
a model update component that updates the industrial asset model, resulting in an updated industrial asset model, wherein updating the industrial asset model comprises associating the industrial data with the industrial device.

2. The system of claim 1, wherein the first data format is determined, by the data transformation component, not to be compatible with the industrial asset model.

3. The system of claim 1, wherein the industrial data comprises engineering data applicable to an industrial device represented in the industrial asset model.

4. The system of claim 3, wherein the engineering data comprises computer aided design data, schematic data, industrial device instruction manual data, configuration data, or control program file data.

5. The system of claim 1, wherein the executable components further comprise:
an output component that, in response to the industrial data being converted from the first data format to the second data format, generates an output indicative of the conversion of the industrial data from the first data format to the second data format.

6. The system of claim 1, wherein the device interface component retrieves the industrial data, using the data connection, via a gateway device communicatively coupled to an industrial device determined to comprise the industrial data.

7. The system of claim 1, wherein
a first copy of the industrial data, in the first data format, is stored in a historian device,
a second copy of the industrial data, in the second data format, is stored in an industrial device represented in the industrial asset model, and
the device interface component establishes the data connection between the industrial asset model and the historian device.

8. The system of claim 1, wherein the device interface component provides the industrial data, in the second data format, to the industrial asset model.

9. A method, comprising:
matching, by an industrial system comprising at least one processor, industrial data, accessible via an industrial asset model and determined not to be represented in the industrial asset model, to an industrial device represented in the industrial asset model;
in response to determining a data path to be traversed to obtain the industrial data from the industrial device, establishing, by the industrial system, a data connection along the data path from the industrial data to the industrial asset model, wherein the data path has been determined to minimize respective computational loads on respective devices on the data path;
in response to a determination that the industrial data comprises a first data format, converting, by the industrial system, the industrial data from the first data format to a second data format, wherein the second data format is compatible with the industrial asset model; and
updating, by the industrial system, the industrial asset model, resulting in an updated industrial asset model, wherein updating the industrial asset model comprises associating the industrial data with the industrial device.

10. The method of claim 9, wherein the first data format is determined not to be compatible with the industrial asset model.

11. The method of claim 9, wherein the industrial data comprises engineering data applicable to an industrial device represented in the industrial asset model.

12. The method of claim 11, wherein the engineering data comprises computer aided design data, schematic data, industrial device instruction manual data, configuration data, or control program file data.

13. The method of claim 9, further comprising:
in response to the industrial data being converted from the first data format to the second data format, generating, by the industrial system, an output indicative of the conversion of the industrial data from the first data format to the second data format.

14. The method of claim 9, further comprising:
retrieving, by the industrial system, the industrial data, using the data connection, via a gateway device communicatively coupled to an industrial device determined to comprise the industrial data.

15. The method of claim 9, wherein
a first copy of the industrial data, in the first data format, is stored in a historian device,
a second copy of the industrial data, in the second data format, is stored in an industrial device represented in the industrial asset model, and
the method further comprises:
establishing, by the industrial system, the data connection between the industrial asset model and the historian device.

16. The method of claim 9, further comprising:
providing, by the industrial system, the industrial data, in the second data format, to the industrial asset model.

17. A non-transitory computer-readable medium having stored thereon instructions that, in response to execution, cause an industrial system comprising at least one processor to perform operations, the operations comprising:
matching industrial data, accessible via an industrial asset model and determined not to be represented in the industrial asset model, to an industrial device represented in the industrial asset model;
in response to determining a data path to be traversed to obtain the industrial data from the industrial device, establishing a data connection along the data path from the industrial data to the industrial asset model, wherein the data path has been determined to minimize respective computational loads on respective devices on the data path;

in response to a determination that the industrial data comprises a first data format, converting the industrial data from the first data format to a second data format, wherein the second data format is compatible with the industrial asset model; and updating, by the industrial system, the industrial asset model, resulting in an updated industrial asset model, wherein updating the industrial asset model comprises associating the industrial data with the industrial device.

18. The non-transitory computer-readable medium of claim 17, wherein the operations further comprise:

in response to the industrial data being converted from the first data format to the second data format, generating an output indicative of the conversion of the industrial data from the first data format to the second data format.

19. The non-transitory computer-readable medium of claim 17, wherein a first copy of the industrial data, in the first data format, is stored in a historian device, a second copy of the industrial data, in the second data format, is stored in an industrial device represented in the industrial asset model, and the operations further comprise:

establishing the data connection between the industrial asset model and the historian device.

20. The non-transitory computer-readable medium of claim 17, wherein the operations further comprise:

providing the industrial data, in the second data format, to the industrial asset model.

* * * * *